US006658237B1

(12) United States Patent
Rozenblit et al.

(10) Patent No.: US 6,658,237 B1
(45) Date of Patent: *Dec. 2, 2003

(54) MULTI-BAND TRANSCEIVER UTILIZING DIRECT CONVERSION RECEIVER

(75) Inventors: Dmitriy Rozenblit, Irvine, CA (US); William J. Domino, Yorba Linda, CA (US); Morten Damgaard, Laguna Hills, CA (US); Mark Oskowsky, San Jose, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/386,865

(22) Filed: Aug. 31, 1999

Related U.S. Application Data

(63) Continuation-in-part of application No. 09/260,919, filed on Mar. 2, 1999, now Pat. No. 6,360,087.

(51) Int. Cl.[7] .................................................. H04B 1/44
(52) U.S. Cl. .............................. 455/83; 455/147; 331/2
(58) Field of Search .......................... 455/168.1, 179.1, 455/180.1, 189.1, 147, 314, 333, 131, 150.1, 161.1, 176.1, 188.1, 83, 86, 84; 375/232, 316, 324, 255

(56) References Cited

U.S. PATENT DOCUMENTS

| | | | | |
|---|---|---|---|---|
| 5,983,081 A | * | 11/1999 | Lehtinen | 455/179.1 |
| 6,029,052 A | * | 2/2000 | Isberg et al. | 455/131 |
| 6,215,988 B1 | * | 4/2001 | Matero | 455/112 |
| 6,243,569 B1 | * | 6/2001 | Atkinson | 455/260 |
| 6,360,087 B1 | * | 3/2002 | Rozenblit et al. | 455/255 |
| 6,397,044 B1 | * | 5/2002 | Nash et al. | 455/112 |

FOREIGN PATENT DOCUMENTS

| | | | | |
|---|---|---|---|---|
| EP | 0 798 880 A | | 10/1997 | |
| GB | 2287144 | * | 2/1994 | H04B/7/30 |
| WO | 92 01337 A | | 1/1992 | |

OTHER PUBLICATIONS

Ian Doyle, "A Simplified Subharmonic I/Q Modulator", *Applied Microwave & Wireless*, Oct. 1998.

Takafumi Yamaji et al., "An I/Q Active Balanced harmonic Mixer with IM2 Cancelers and a 45 ° Phase Shifter", *IEEE Journal of Solid–State Circuits*, vol. 33, No. 12, Dec. 1998.

* cited by examiner

*Primary Examiner*—Nay Maung
*Assistant Examiner*—Tilahun Gesesse
(74) *Attorney, Agent, or Firm*—Mintz Levin Cohn Ferris Glovksy & Popeo

(57) ABSTRACT

A multi-band transceiver having a receiver portion and a transmitter portion, wherein the receiver portion includes a direct conversion receiver system for directly downconverting a signal to baseband frequencies. The direct conversion receiver system includes a frequency translator having first and second inputs and an output. A first signal at a first frequency is applied to the first input. A second signal having a second frequency is applied to the second input. The first frequency is preferably an nth order subharmonic of the second frequency, wherein n is an integer greater than 1. A low pass filter is integral with or inherent to the first input, and a high pass filter is integral with or inherent to the second input. The corner frequencies of both the low pass and high pass filters is above the first frequency and below the second frequency.

31 Claims, 19 Drawing Sheets

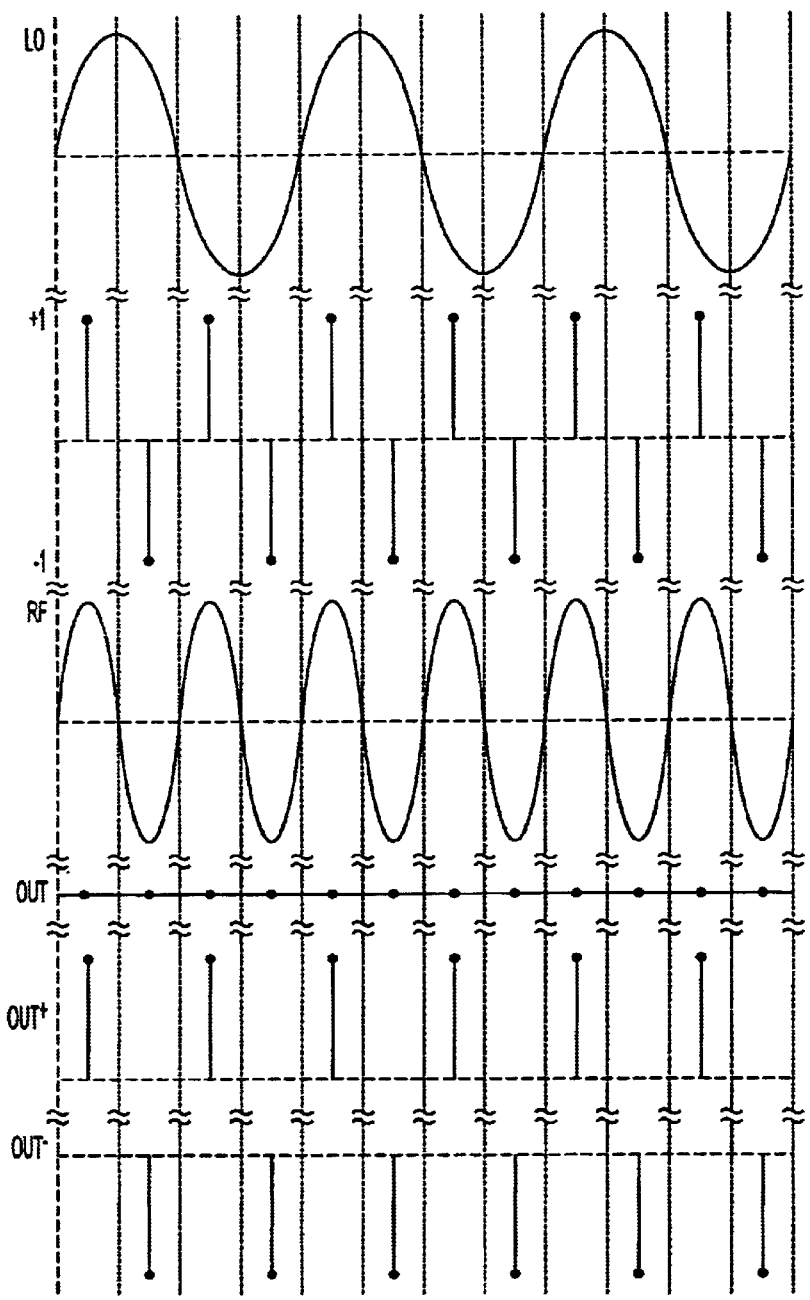

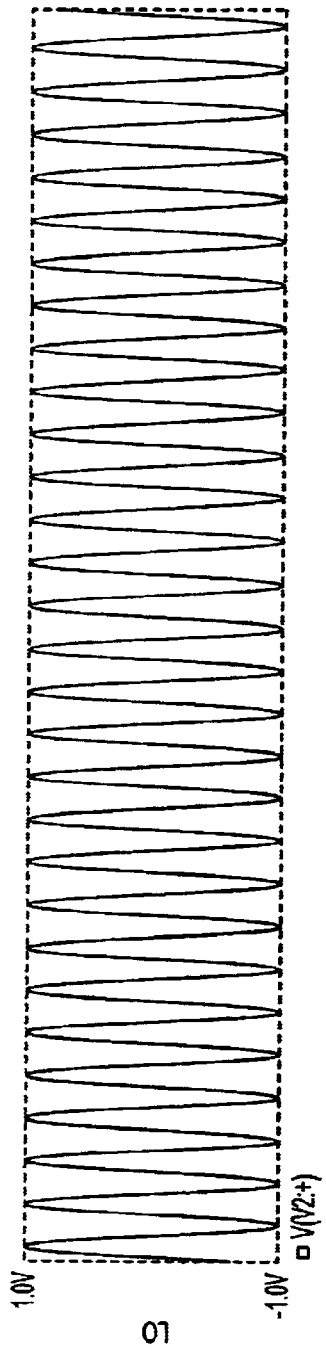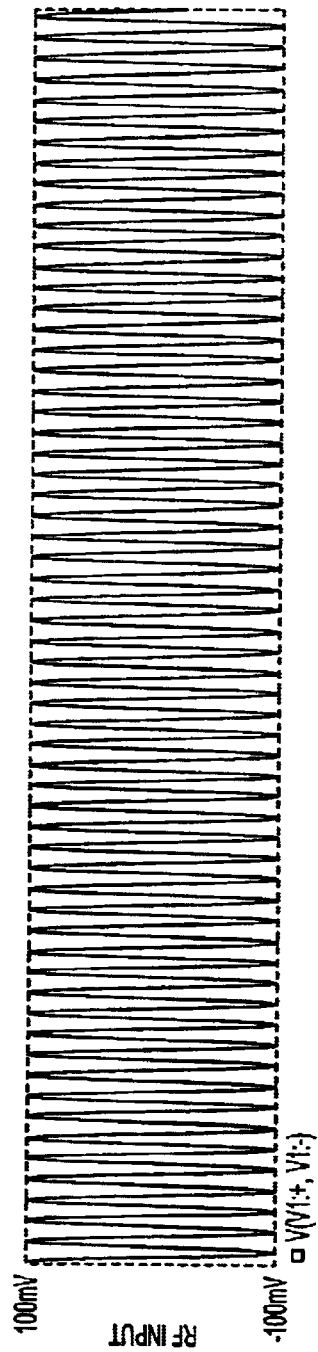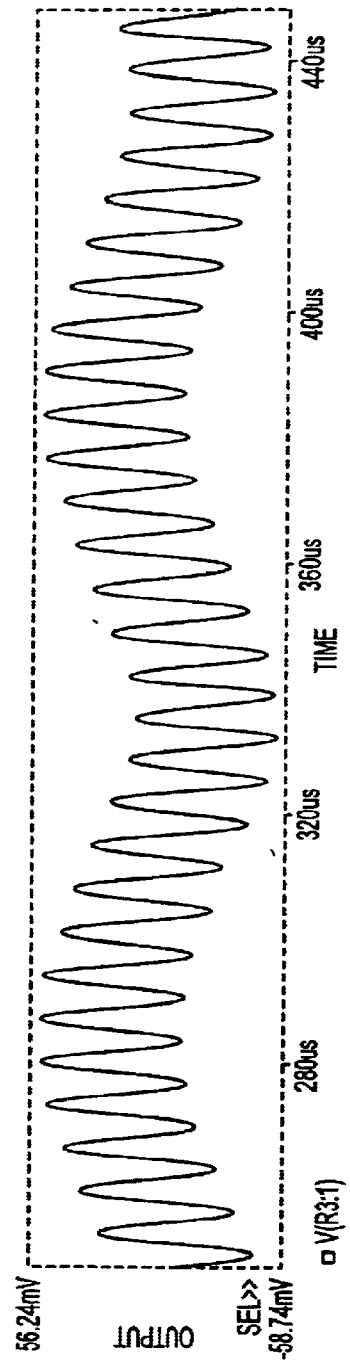

MULTI-BAND TRANSCEIVER UTILIZING DIRECT CONVERSION RECEIVER

This application is a continuation-in-part of U.S. patent application Ser. No. 09/260,919, filed Mar. 2, 1999 now U.S. Pat. No. 6,360,087, entitled "DIRECT CONVERSION RECEIVER," which is hereby fully incorporated by reference herein as through set forth in full.

BACKGROUND OF THE INVENTION

I. Field of the Invention

This invention relates generally to the field of wireless communications, and, more specifically, to a multi-band transceiver for a wireless communication device or handset.

II. Background

Wireless communication systems are an integral component of the ongoing technology revolution. Mobile radio communication systems, such as cellular telephone systems, are evolving at an exponential rate. In a cellular system, a coverage area is divided into a plurality of "cells". A cell is the coverage area of a base station or transmitter. Low power transmitters are utilized, so that frequencies used in one cell can also be used in cells that are sufficiently distant to avoid interference. Hence, a cellular telephone user, whether mired in traffic gridlock or attending a meeting, can transmit and receive phone calls so long as the user is within a "cell" served by a base station.

Mobile cellular systems were originally developed as analog systems. After their introduction for commercial use in the early 1980s, mobile cellular systems began to experience rapid and uncoordinated growth. In Europe, for example, individual countries developed their own systems. Generally, the systems of individual countries were incompatible, which constricted mobile communications within national boundaries and restricted the market for mobile equipment developed for a particular country's system. In 1982, in order to address this growing problem, the Conference of European Posts and Telecommunications (CEPT) formed the Groupe Speciale Mobile (GSM) to study and develop a set of common standards for a future pan-European cellular network. It was recommended that two blocks of frequencies in the 900 MHz range be set aside for the system. The initial goals for the new system included international roaming ability, good subjective voice quality, compatibility with other systems such as the Integrated Services Digital Network (ISDN), spectral efficiency, low handset and base station costs, and the ability to support new services and a high volume of users.

One of the initial, major decisions in the development of the GSM standard was adoption of a digital, rather than an analog, system. As mentioned above, analog systems were experiencing rapid growth and the increasing demand was straining the capacity of the available frequency bands. Digital systems offer improved spectral efficiency and are more cost efficient. The quality of digital transmission is also superior to that of analog transmission. Background sounds such as hissing and static and degrading effects such as fadeout and cross talk are largely eliminated in digital systems. Security features such as encryption are more easily implemented in a digital system. Compatibility with the ISDN is more easily achieved with a digital system. Finally, a digital approach permits the use of Very Large Scale Integration (VLSI), thereby facilitating the development of cheaper and smaller mobile handsets.

In 1989, the European Telecommunications Standards Institute (ETSI) took over responsibility for the GSM standards. In 1990, phase I of the standard was published and the first commercial services employing the GSM standard were launched in 1991. It was also renamed in 1991 as the Global System for Mobile Communications (still GSM). After its early introduction in Europe, the standard was elevated to a global stage in 1992 when introduced in Australia. Since then, GSM has become the most widely adopted and fastest growing digital cellular standard, and is positioned to become the world's dominant cellular standard. With (currently) 324 GSM networks in operation in 129 countries, GSM provides almost complete global coverage. As of January 1999, according to the GSM Memorandum of Understanding Association, GSM accounted for more than 120 million subscribers. Market research firms estimate that by 2001, there will be more than 250 million GSM subscribers worldwide. At that time, GSM will account for almost 60% of the global cellular subscriber base, with yearly shipments exceeding 100 million phones.

Two frequency bands of 25 MHz were allocated for GSM use. As illustrated in FIG. 1a, the 890–915 MHz band is reserved for transmission or "uplink" (mobile station to base station), and the 935–960 MHz band is reserved for reception or "downlink" (base station to mobile station). An extra ten MHz of bandwidth was later added to each frequency band. The standard incorporating this extra bandwidth (two 35 MHz bands) is known as Extended GSM (EGSM). In EGSM, the transmission band covers 880–915 MHz and the receiving band covers 925–960 MHz (FIG. 1b). The terms GSM and EGSM are used interchangeably, with GSM sometimes used in reference to the extended bandwidth portions (880–890 MHz and 925–935 MHz). Sometimes, the originally specified 890–915 MHz and 935–960 MHz bands are designated Primary GSM (PGSM). In the following description, GSM will be used in reference to the extended bandwidth (35 MHz) standard.

Due to the expected widespread use of GSM, capacity problems in the 900 MHz frequency bands were anticipated and addressed. ETSI had already defined an 1800 MHz variant (DCS or GSM 1800) in the first release of the GSM standard in 1989. In DCS, the transmission band covers 1710–1785 MHz and the receiving band covers 1805–1880 MHz (FIG. 1c). In the United States, the Federal Communications Commission (FCC) auctioned large blocks of spectrum in the 1900 MHz band, aiming to introduce digital wireless networks to the country in the form of a mass market Personal Communication Service (PCS). The GSM service in the US is known as PCS or GSM 1900. In PCS, the transmission band covers 1850–1910 MHz and the receiving band covers 1930–1990 MHz (FIG. 1d).

Regardless of which GSM standard is used, once a mobile station is assigned a channel, a fixed frequency relation is maintained between the transmit and receive frequency bands. In GSM (900 MHz), this fixed frequency relation is 45 MHz. If, for example, a mobile station is assigned a transmit channel at 895.2 MHz, its receive channel will always be at 940.2 MHz. This also holds true for DCS and PCS; the frequency relation is just different. In DCS, the receive channel is always 95 MHz higher than the transmit channel and, in PCS, the receive channel is 80 MHz higher than the transmit channel. This frequency differential will be referred to in the ensuing discussion as the frequency offset.

The architecture of one implementation of a GSM network 20 is depicted in block form in FIG. 2. GSM network 20 is divided into four interconnected components or subsystems: a Mobile Station (MS) 30, a Base Station Subsystem (BSS) 40, a Network Switching Subsystem (NSS) 50 and an Operation Support Subsystem (OSS) 60. Generally, MS 30 is the mobile equipment or phone carried by the user; BSS 40 interfaces with multiple MSs 30 and manages the radio transmission paths between the MSs and NSS 50; NSS 50 manages system switching functions and facilitates communications with other networks such as the PSTN and the ISDN; and OSS 60 facilitates operation and maintenance of the GSM network.

Mobile Station 30 comprises Mobile Equipment (ME) 32 and Subscriber Identity Module (SIM) 34. ME 32 is typically a digital mobile phone or handset. SIM 34 is a memory device that stores subscriber and handset identification information. It is implemented as a smart card or as a plug-in module and activates service from any GSM phone. Among the information stored on SIM 34 are a unique International Mobile Subscriber Identity (IMSI) that identifies the subscriber to system 20, and an International Mobile Equipment Identity (IMEI) that uniquely identifies the mobile equipment. A user can access the GSM network via any GSM handset or terminal through use of the SIM. Other information, such as a personal identification number (PIN) and billing information, may be stored on SIM 34.

MS 30 communicates with BSS 40 across a standardized "Um" or radio air interface 36. BSS 40 comprises multiple base transceiver stations (BTS) 42 and base station controllers (BSC) 44. A BTS is usually in the center of a cell and consists of one or more radio transceivers with an antenna. It establishes radio links and handles radio communications over the Um interface with mobile stations within the cell. The transmitting power of the BTS defines the size of the cell. Each BSC 44 manages multiple, as many as hundreds of, BTSs 42. BTS-BSC communication is over a standardized "Abis" interface 46, which is specified by GSM to be standardized for all manufacturers. The BSC allocates and manages radio channels and controls handovers of calls between its BTSs.

The BSCs of BSS 40 communicate with network subsystem 50 over a GSM standardized "A" interface 51. The A interface uses an SS7 protocol and allows use of base stations and switching equipment made by different manufacturers. Mobile Switching Center (MSC) 52 is the primary component of NSS 50. MSC 52 manages communications between mobile subscribers and between mobile subscribers and public networks 70. Examples of public networks 70 that MSC 52 may interface with include Integrated Services Digital Network (ISDN) 72, Public Switched Telephone Network (PSTN) 74, Public Land Mobile Network (PLMN) 76 and Packet Switched Public Data Network (PSPDN) 78.

MSC 52 interfaces with four databases to manage communication and switching functions. Home Location Register (HLR) 54 contains details on each subscriber residing within the area served by the MSC, including subscriber identities, services to which they have access, and their current location within the network. Visitor Location Register (VLR) 56 temporarily stores data about roaming subscribers within a coverage area of a particular MSC. Equipment Identity Register (EIR) 58 contains a list of mobile equipment, each of which is identified by an IMEI, which is valid and authorized to use the network. Equipment that has been reported as lost or stolen is stored on a separate list of invalid equipment that allows identification of subscribers attempting to use such equipment. The Authorization Center (AuC) 59 stores authentication and encyrption data and parameters that verify a subscriber's identity.

OSS 60 contains one or several Operation Maintenance Centers (OMC) that monitor and maintain the performance of all components of the GSM network. OSS 60 maintains all hardware and network operations, manages charging and billing operations and manages all mobile equipment within the system.

The GSM transmitting and receiving bands are divided into 200 kHz carrier frequency bands. Using Time Division Multiple Access techniques (TDMA), each of the carrier frequencies is subdivided in time into eight time slots. Each time slot has a duration of approximately 0.577 ms, and eight time slots form a TDMA "frame", having a duration of 4.615 ms. One implementation of a conventional TDMA frame 80 having eight time slots 0–7 is illustrated in FIG. 3.

In this conventional TDMA framework, each mobile station is assigned one time slot for receiving data and one time slot for transmitting data. In TDMA frame 80, for example, time slot zero has been assigned to receive data and time slot four has been assigned to transmit data. The receive slot is also referred to as the downlink slot and the transmit slot is referred to as the uplink slot. After the eight slots, the remaining slots are used for offset, control, monitoring and other operations. This framework permits concurrent reception by as many as eight mobile stations on one frequency and concurrent transmission by as many as eight mobile stations on one frequency.

As described above, there are currently three GSM frequency bands defined. With the proliferation of wireless handset usage showing now signs of slowing down, it is likely that additional bands will be defined in the future. Hence, GSM mobile stations intended for global usage should have multi-band capability. Unfortunately, because of the widely disparate frequency ranges of the GSM, DCS, and PCS systems, a transceiver with a single main oscillator has not been able to cover the required frequencies. Moreover, designs employing separate oscillators for each of the bands are not feasible because of the cost involved, while designs employing a single switchable oscillator typically suffer from poor performance.

Another problem is that current multi-band handsets utilize off-chip components such as the receiver's intermediate frequency (IF) filter which, in one conventional design, comprises a surface acoustical wave (SAW) filter. Components such as this tend to be large and bulky, and consume excessive space. Thus, they are inconsistent with subscribers' demand for handsets are as compact, lightweight, and mobile as possible.

Direct conversion receivers eliminate the need for IF filters. However, current direct conversion receivers are susceptible to self-conversion to DC of the local oscillator signal or large RF blockers.

This problem can be further explained with reference to FIG. 4, which illustrates a conventional direct conversion receiver. As illustrated, the receiver of FIG. 4 comprises an antenna 200 coupled to the radio frequency ("RF") input port 219 of mixer 211. Mixer 211 has a local oscillator ("LO") input port 214, and an output port 201. The mixer mixes the signals provided at the RF and LO input ports, and provides the mixed signal to the output port. In the receiver of FIG. 4, the frequency of the signal provided at the LO input port, $f_{LO}$, is matched to the frequency of the carrier frequency, $f_{RF}$, of the signal provided at the RF input port such that $f_{LO}=f_{RF}$. The mixed signal provided at the output port 201 of mixer 211 has a first order component at the baseband frequency, $f_{BB}$, and a first component at twice the LO or RF carrier frequencies, or $2f_{LO}$.

The output port 201 of mixer 214 is coupled to LPF 212 through signal line 213. The purpose of LPF 212 is to select only the baseband component of the signal output from mixer 211 while suppressing the higher frequency component at the frequency $2f_{LO}$. LPF 212 also rejects any unwanted signals outside the desired band around $f_{BB}$. The output of the LPF 212 is provided on signal line 215. It represents the baseband portion of the RF signal received over antenna 200.

An advantage of the design of FIG. 4 is the elimination of the IF filter, and related components such as a second mixer. However, a problem with this design is its vulnerability to leakage between the signals on the RF and IF input ports of the mixer. This problem is explained further in the following section.

With reference to FIG. 4, consider the case in which a portion of the signal provided at the LO input port leaks onto the RF input port. Such is identified with reference numeral 216 in FIG. 4. This portion will be mixed by mixer 211 with the original LO signal, thus producing a distortion in the output signal at the baseband frequency. Since this distortion is at the baseband frequency, it will pass through LPF 212, and appear in the output signal provided on signal line 215. The result is that this output signal is distorted in relation to the original transmitted baseband signal.

Consider next the case in which a portion of the signal provided at the RF input port leaks onto the LO input port. Such is represented by identifying numeral 217 in FIG. 4. This portion will be mixed by mixer 211 with the original RF signal, thus producing a distortion in the output of the mixer at the baseband frequency. Again, this distortion, being at the baseband frequency, will appear in the output signal provided on signal line 215.

In addition to leakage between the RF and LO input ports, another problem stems from the LO signal leaking onto and being radiated by antenna 200. This leakage is represented by identifying numeral 218 in FIG. 4. This leakage can interfere with other similar receivers that may be present in the same geographical area since the radiated LO component is at the same frequency as the RF signals received by these other receivers.

This leakage problem renders the direct conversion receiver of FIG. 4 unsuitable for use in applications such as GSM mobile wireless handsets, and other systems with large blocker suppression requirements, because the distortion introduced by the leakage is unacceptable for these applications.

Efforts to solve this problem have involved shielding and physical separation between the RF and LO inputs. Shielding, however, is expensive and often ineffective at the high frequencies which typically characterize current mobile wireless phones, 900 MHz or more. Moreover, physical separation is impractical for use in wireless handsets, in which space is at a premium. Port to port isolation of the mixer is also a finite value which typically becomes less at higher frequencies.

The distortion introduced by leakage always results in unwanted DC at the mixer output. For GSM and some other systems, this DC is not allowed to be removed by mechanisms such as a blocking capacitor because the desired signal may itself contain DC.

Accordingly, there is a need for a multi-band transceiver which overcomes the disadvantages of the prior art.

SUMMARY OF THE INVENTION

In accordance with the purpose of the invention as broadly described herein, there is provided a multi-band transceiver for transmitting and receiving RF signals in one of a plurality of frequency bands. Advantageously, the transceiver is configured for use in a wireless communication device, whether a mobile device or handset, or a base station or other infrastructure component. In one implementation, the transceiver is configured for the GSM and DCS bands; in another, the GSM, DCS, and PCS bands.

The receiver portion of the transceiver includes a direct conversion receiver (DCR). A signal derived from a tunable local oscillator services the receiver. In addition, in one embodiment, the local oscillator is shared with an upconverter in the transmitter portion of the transceiver.

The direct conversion receiver includes a frequency translator having first and second ports. In one implementation, the frequency translator is a mixer. In another, it is a multiplier. A first filter is coupled to the first port, and a second filter is coupled to the second port. Preferably, the filters are integral with or inherent to the ports so that the frequency translator lacks exposed unfiltered ports. A third filter is coupled to the output of the frequency translator. It is advantageously a low pass filter configured to provide as an output signal the baseband component of the signal output from the frequency translator.

In operation, one of the plurality of bands is selected. A signal derived from the output of the local oscillator is coupled to the first filtered port of the frequency translator of the DCR. The frequency $f_1$ of the signal is set through suitable tuning of the local oscillator such that it is about an nth order subharmonic of the carrier frequency $f_2$ of the signal that is to be applied to the second filtered port of the frequency translator of the DCR, wherein n is an integer greater than 1. That is to say, $f_1 \cong (1/n)f_2$, wherein n is an integer greater than 1. (For purposes of this disclosure, use of the terms such as "about" or "approximately" or "substantially" or the symbol "$\cong$" for describing frequency or timing relationships between signals and the like is intended to take account of tolerances which are acceptable in the trade, and to allow some leeway in the description of these relationships which is consistent with these tolerances when strict mathematical exactitude may not be possible.)

The first filter is preferably a low pass filter having a corner frequency below the selected band, and above the frequency of the nth order harmonic. In other words, the corner frequency is above $f_1$ and below $f_2$. Consequently, it is configured to substantially attenuate the frequency $f_2$ to the first unfiltered port of the frequency translator. Similarly, the second filter is preferably a high pass filter having a corner frequency below the selected band, and above the frequency of the nth order harmonic. Again, the corner frequency is above $f_1$ and below $f_2$. Consequently, it is configured to attenuate the first frequency $f_1$ to the second unfiltered port of the frequency translator.

Through operation of these filters, the effects of leakage between the first and second ports of the frequency translator are eliminated or reduced. Leakage from the first port to the second port will be at the frequency $f_1$, and thus attenuated by the second filter. Similarly, leakage from the second port to the first port will be at the frequency $f_2$, and thus attenuated by the first filter. Thirdly, radiation at the frequency $f_1$ out through the antenna will be blocked by a bandpass filter located upstream of the DCR which has a passband centered on the selected band.

In one embodiment, the frequency translator is a multiplier configured to multiply the signals at the first and second input ports thereof. In another embodiment, the frequency translator is a mixer configured to switch the second input to the output through a switching action which is performed at a switching or sampling rate of n times the frequency $f_1$ of the signal applied to the first input of the mixer. By switching at n times the frequency $f_1$, the mixer conserves frequency in that more energy is packed into the baseband component of the output of the mixer output than if the switching action were performed at the frequency $f_1$.

In one embodiment, the transmitter portion of the transceiver comprises a modulator coupled to an upconverter. A carrier input source provides the carrier input to the modulator. The carrier input source comprises a frequency adjuster coupled to the output of the crystal oscillator providing the reference frequency to the phase locked loop which comprises the local oscillator. The frequency adjuster is configured to receive the output of the crystal oscillator, and to provide an output signal having a frequency which is equal to the frequency of the output of the crystal oscillator adjusted by a variable amount responsive to the selected frequency band. In one implementation, the frequency adjuster is a frequency multiplier.

In a second embodiment, the carrier input source comprises a frequency adjuster coupled to the output of the phase locked loop which comprises the local oscillator. The frequency adjuster is configured to receive the output of the phase locked loop, and to provide an output signal having a frequency which is equal to the frequency of the output of the phase locked loop adjusted by a variable amount responsive to the selected frequency band. In one implementation, the frequency adjuster is a frequency divider.

In a third embodiment, the modulator is within a loop of a translation loop upconverter, and the carrier input of the modulator is derived from a downconversion frequency translator included within the loop.

In one configuration, the modulator is a quadrature modulator, the upconverter is a translation loop upconverter, and the carrier input source is a low frequency offset source. In one implementation, the quadrature modulator and low frequency offset source are outside the loop of the translation loop upconverter. In a second implementation, the quadrature modulator and low frequency offset source are within the loop of the translation loop upconverter.

In the case of the first configuration, a low frequency offset source provides the carrier input to the quadrature modulator. The frequency of the carrier signal is a variable depending on the selected band. It is selected to be about equal to the offset frequency for the selected band, that is, the offset between the transmit and receive channels for the selected band. The translation loop upconverter includes a transmit downconversion frequency translator. The frequency translator is of the type which switches or samples at n times the frequency of the signal provided at the first input thereof. The value of n for this frequency translator is the same as that for the frequency translator in the DCR of the receiver portion of the transceiver.

In the case of the second configuration, the carrier signal for the quadrature modulator is derived from the output of the frequency translator in the translation loop. The loop is configured so that the frequency of the output of the frequency translator is, after suitable filtering, about equal to the frequency offset for the selected band. In that sense, the frequency translator functions as the low frequency offset source.

In both configurations, a low pass filter is inherent to or integral with the first input of the frequency translator, such that the unfiltered first input is covered and not exposed. The local oscillator in the receiver portion of the transceiver is shared with the frequency translator in the translation loop upconverter in that a signal derived from the local oscillator is coupled to the filtered first input of the frequency translator. In operation, the frequency of the signal applied to this input is about an nth order subharmonic of the signal applied to the second input of the frequency translator, wherein n is an integer greater than 1.

The translation loop upconverter in both configurations receives the output of the quadrature modulator and increases the carrier frequency of this output to about the appropriate frequency for transmission. This frequency is the frequency of the selected receive channel in the selected band minus the frequency offset for the selected band.

In one implementation, each of the foregoing frequency translators is a mixer, with the first input port being an LO input port, and the second input port being an RF input port. In this implementation, a procedure known as half-frequency injection is utilized. According to this procedure, the frequency $f_1$ of the signal applied to the LO input port is ½ of the frequency $f_2$, the carrier frequency of the RF signal applied to the second port.

In one implementation example, the transceiver is configured to handle the GSM and DCS bands. In this implementation, two switchable and selectable DCRs are provided. In operation, the DCR corresponding to the selected band is selected and switched such that it is in the signal path from the baseband filter to the switch/band selector. The first DCR is preceded by a bandpass filter having a passband defined by the GSM receive band, 925–960 MHz. The second DCR is preceded by a passband defined by the DCS receive band, 1805–1880 MHz. The local oscillator in this implementation is the output of a phase locked loop (PLL). The PLL includes a fractional N synthesizer. A reference divider at the output of a crystal oscillator at 13 MHz provides the reference frequency to the PLL. The output of the PLL is tunable in the range of 450.25 MHz to 480 MHz. The output of the PLL is applied to the LO input of the mixer in the first DCR. The output of the PLL is also passed through a doubler, and the output of the doubler is applied to the LO input of the mixer of the second DCR.

In the case in which the GSM band is selected, the PLL is tuned such that the frequency of the output thereof is about ½ the frequency of the selected channel in the GSM band. In the case in which the DCS band is selected, the PLL is tuned so that the output thereof is about ¼ the frequency of the selected channel on the DCS band. This way, through action of the doubler, the signal which is applied to the LO input of the mixer in the DCR corresponding to the DCS band is about ½ the frequency of the selected channel in the DCS band.

In one configuration of this implementation, a transmitter portion of the transceiver includes a quadrature modulator followed by a translation loop upconverter. A low frequency offset source provides a carrier input to the quadrature modulator at a frequency about equal to the frequency offset between the receive and transmit channels for the selected band. As discussed, the frequency offset for the GSM band is 45 MHz, that for the DC band is 95 MHz, and that for the PCS band is 80 MHz.

In one example of this configuration, the carrier input is derived by multiplication of the crystal oscillator reference frequency by a multiplication factor which depends on the selected band. For the GSM band, assuming a 13 MHz crystal oscillator reference frequency, the multiplication factor is advantageously 3, yielding a carrier offset of 39 MHz. For the DCS band, again assuming a 13 MHz crystal oscillator reference frequency, the multiplication factor is advantageously 7, yielding a carrier offset of 91 MHz.

In another example of this configuration, the carrier input is derived by dividing the output of the PLL by a division factor which depends on the selected band. For the GSM band, assuming a PLL output frequency of 450–480 MHz, the division factor is advantageously 10, yielding a carrier offset in the range of 45–48 MHz. For the DCS band, again assuming a PLL output frequency of 450–480 MHz, the division factor is advantageously 5, yielding a carrier offset in the range of 90–96 MHz.

In a second configuration of this implementation, the quadrature modulator is contained within the loop of the translation loop upconverter in that the output of the downconversion mixer in the loop provides, after suitable filtering, the carrier input of the quadrature modulator. The loop is configured such that the carrier input to the quadrature modulator is about the frequency offset for the selected band.

In both configurations, the translation loop upconverter is configured to increase the carrier frequency of the output of the quadrature modulator so that it is at the appropriate frequency for transmission. In the case of DCS, the transmit band is 1710–1785 MHz. In the case of GSM, the transmit band is 890–915 MHz. The appropriate frequency for transmission is the selected channel within the appropriate transmit band, which has a frequency equal to that of the selected channel in the receive band minus the frequency offset for the band.

In both configurations, the output of the PLL is shared by the translation-loop upconverter in that a signal derived from the output from the PLL is provided to the filtered LO input of the downconversion mixer in the translation loop upconverter. In the case of the GSM band, the PLL output is applied directly to the filtered LO input of the mixer. In the case of the DCS band, the PLL output, after passage through the doubler, is applied to the LO input of the mixer.

A related method of providing full duplex transmission and reception is provided which comprises the following steps: selecting a band from a plurality of bands; receiving a signal at a channel within the selected band, the channel having a frequency; directly converting the signal to a baseband signal using a first signal derived from a local oscillator signal, the first signal being an nth subharmonic of the channel frequency, wherein n is an integer greater than 1; upconverting a second baseband signal to a transmission frequency; and transmitting the upconverted signal.

BRIEF DESCRIPTION OF THE DRAWINGS

The present invention is described with reference to the accompanying drawings. In the drawings, like reference numbers indicate identical or functionally similar elements.

FIGS. 11A–F are example waveforms illustrating operation of a frequency translator in accordance with the subject invention;

FIGS. 18A–18C are example waveforms illustrating operation of the implementation example of FIG. 13.

DETAILED DESCRIPTION OF THE PREFERRED EMBODIMENTS

1. Example Environment

In the discussion below, "GSM" refers to the extended GSM bands of 880–915 MHz for the transmit band and 925–960 MHz for the receive band; "DCS" refers to the bands of 1710–1785 MHz for the transmit band and 1805–1880 MHz for the receive band; and "PCS" refers to the band of 1850–1910 MHz for the transmit band, and 1930–1990 MHz for the receive band.

The subject invention is a multi-band transceiver for transmitting and receiving RF signals in one of a plurality of frequency bands. Advantageously, the transceiver is configured for use in a wireless communication device, such as a mobile device or handset, or an infrastructure component such as a base station or satellite. In one implementation, the transceiver is configured for the GSM and DCS bands. In another implementation, the transceiver is configured to handle the GSM, DCS, and PCS bands.

Figure 1A:
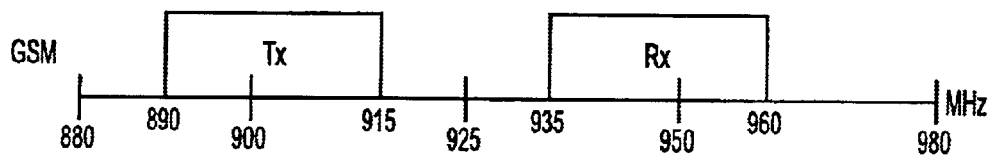
FIG. 1a illustrates the transmit and receive frequency bands under the GSM standard.
Figure 1B:
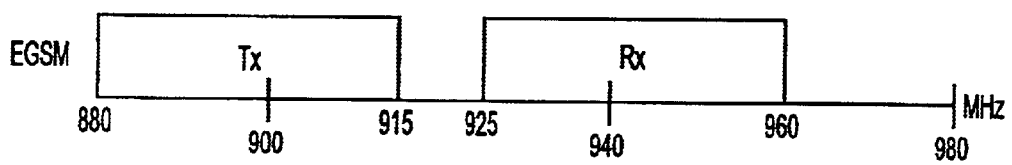
FIG. 1b illustrates the transmit and receive frequency bands under the EGSM standard.
Figure 1C:
FIG. 1c illustrates the transmit and receive frequency bands under the GSM 1800 or DCS standard.
Figure 1D:
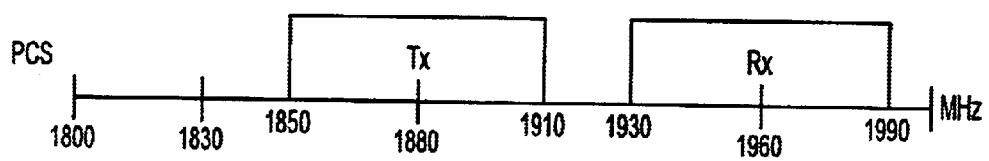
FIG. 1d illustrates the transmit and receive frequency bands under the GSM 1900 or PCS standard.
Figure 2:
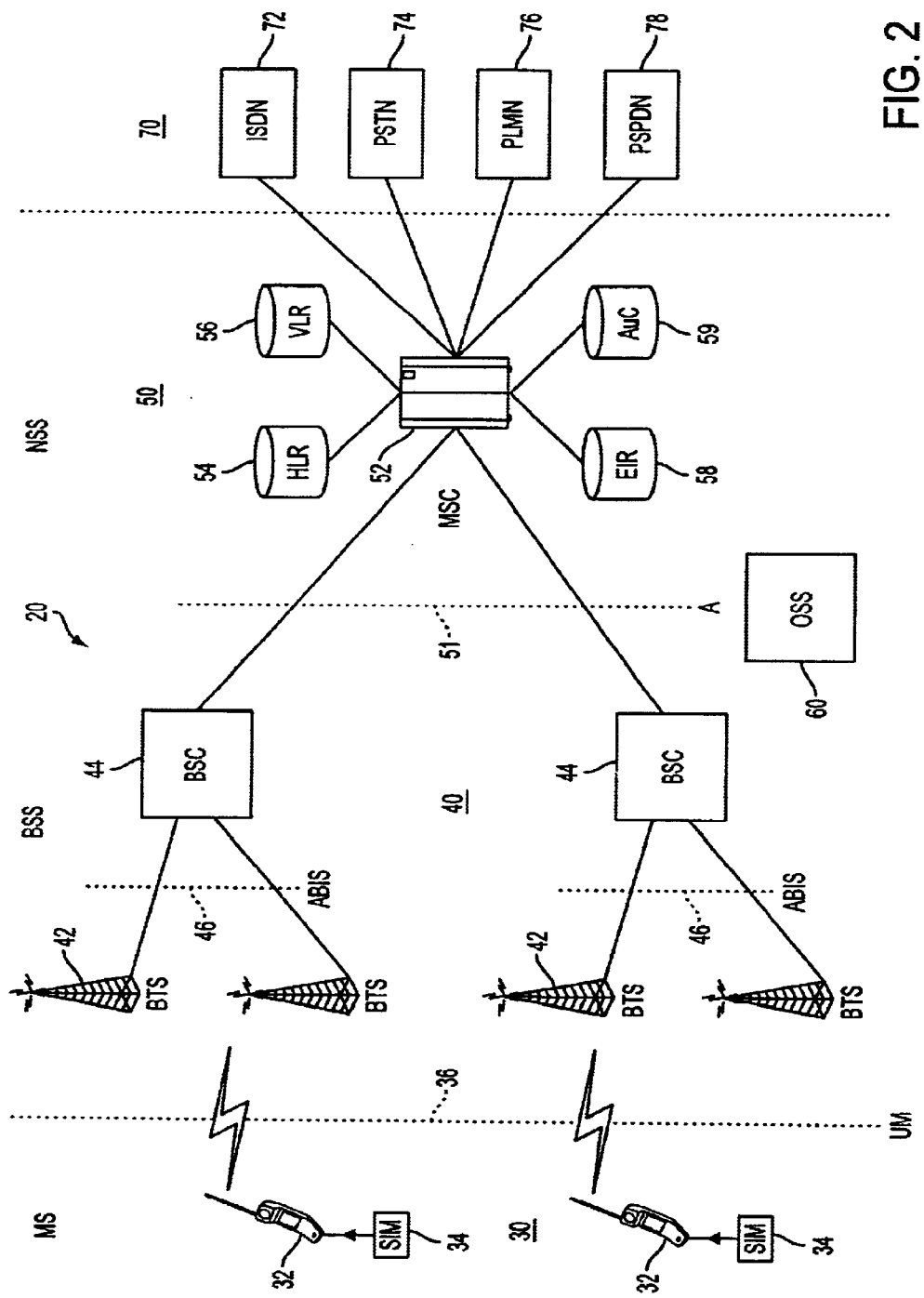
FIG. 2 is a block diagram of an exemplary GSM network.
Figure 5:
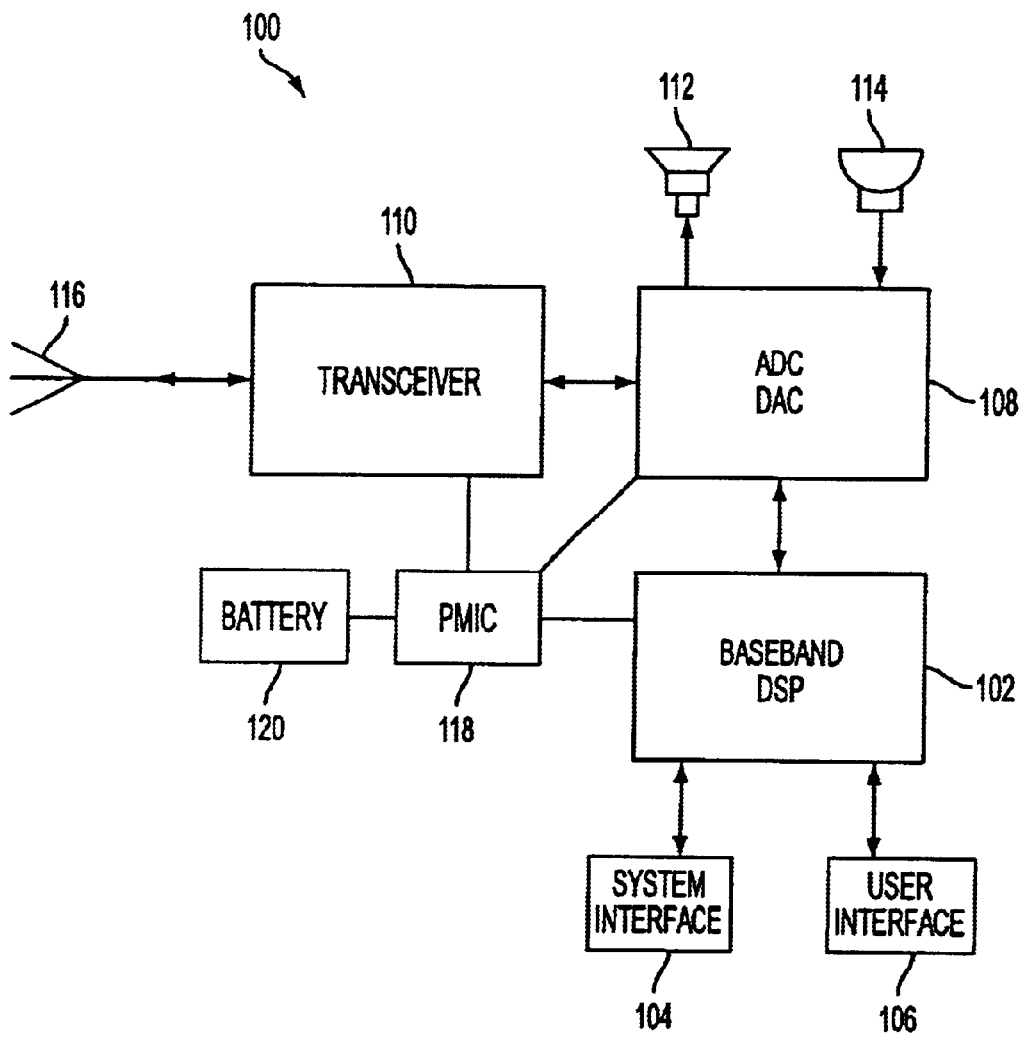
FIG. 5 is a block diagram of a mobile station or handset in accordance with the subject invention.

FIG. 5 is a block diagram of one implementation of a mobile, wireless handset 100 incorporating a transceiver according to the present invention. Handset 100 may operate as a mobile station within a GSM network, such as a mobile station 30 within a GSM network 20 as illustrated in FIG. 2. Handset 100 includes a baseband digital signal processor (DSP) 102, typically integrated on a single die. Baseband DSP 102 directs the overall operation of mobile station 30. It processes baseband data received from antenna 116 and transceiver 110 into an audible acoustic signal for announcement over speaker 112. DSP 102 also processes acoustic data received from microphone 114 into baseband data which is provided to transceiver 110 for transmission over antenna 116.

DSP 102 also manages system and user interface tasks via a system interface 104 and a user interface 106. System interface 104 may include suitable means for managing functions such as GSM network and modem access and subscriber services. User interface 106 may include suitable means for inputting and displaying information, such as a keypad, display, backlight, volume control and real time clock. In one implementation, DSP 102 is housed in a 128-pin TQFP and, in another implementation, DSP 102 is housed in a 160-pin 12×12 mm Chip Array Ball Grid Array (CABGA).

In one implementation, baseband DSP 102 interfaces with transceiver 110, speaker 112 and microphone 114 via integrated analog IC 108. IC 108 implements an analog-to-digital converter (ADC), a digital-to-analog converter (DAC) and all signal conversions required to permit interface between DSP 102 and transceiver 110, speaker 112 and microphone 114. Typically, the ADC and DAC will be embodied in a CODEC. Microphone 114 is configured to convert acoustic signals, typically those in the audio band, into analog electric signals. The signals captured by microphone 114 are decoded and digitized by the ADC in IC 108 and processed into baseband I and Q signals by DSP 102. The digital baseband I and Q signals are converted into an analog signal stream by the DAC in IC 108, and are then modulated and transmitted (via antenna 116) by transceiver 110. Conversely, modulated signals captured by antenna 116 are demodulated and converted into analog baseband I and Q signals by transceiver 110, digitized by IC 108, processed by DSP 102, and converted into an analog acoustic signal by IC 108 that is announced by speaker 112. IC 108 may be implemented in a 100-pin TQFP, a 100-pin 10×10 mm CABGA package or in any other suitable housing. A power management IC (PMIC) 118 is coupled to a battery 120 and integrates on a single die all power supply related functions required by handset 100.

Handset 100 includes band selection means (not shown), such as a menu selection or switch, to permit a user to select one of a plurality of possible bands. Alternatively, or in addition, the band selection means permits automatic selection of the appropriate band, based on a signal from a base station indicating the proper band.

Also included in the handset 100 is a channel selection means (not shown) for selection of the appropriate channel within the selected band responsive to suitable signals from the base station handling the handset at a time. For the GSM, DCS, and PCS bands, the channel is a 200 kHz slot within the selected band. The channel selection means permits selection of either or both of the transmit and receive channels. In one implementation, selection of the transmit channel implies selection of the receive channel, and selection of the receive channel implies selection of the transmit channel, since the two bear a predetermined relationship to one another. For example, for the GSM band, the receive channel is 45 MHz higher than the transmit channel; for the DCS band, the receive channel is 95 MHz higher than the transmit channel; and for the PCS band, the receive channel is 80 MHz higher than the transmit channel. In this implementation, express selection of both the transmit and receive channels is unnecessary.

The handset 100 is preferably configured to permit full duplex transmission, that is, concurrent transmission and reception over respectively the transmit and receive channels.

In one implementation, it is contemplated that the band selection means permits selection of either the GSM band or the DCS band. In another implementation, it is contemplated that the band selection means permits selection of any one of the GSM, DCS, and PCS bands. In other implementations, it is contemplated that the transceiver can be configured to accommodate other combinations of GSM bands, more than two GSM bands, or even to support other (non-GSM) standards.

2. Transceiver Introduction

Figure 6:
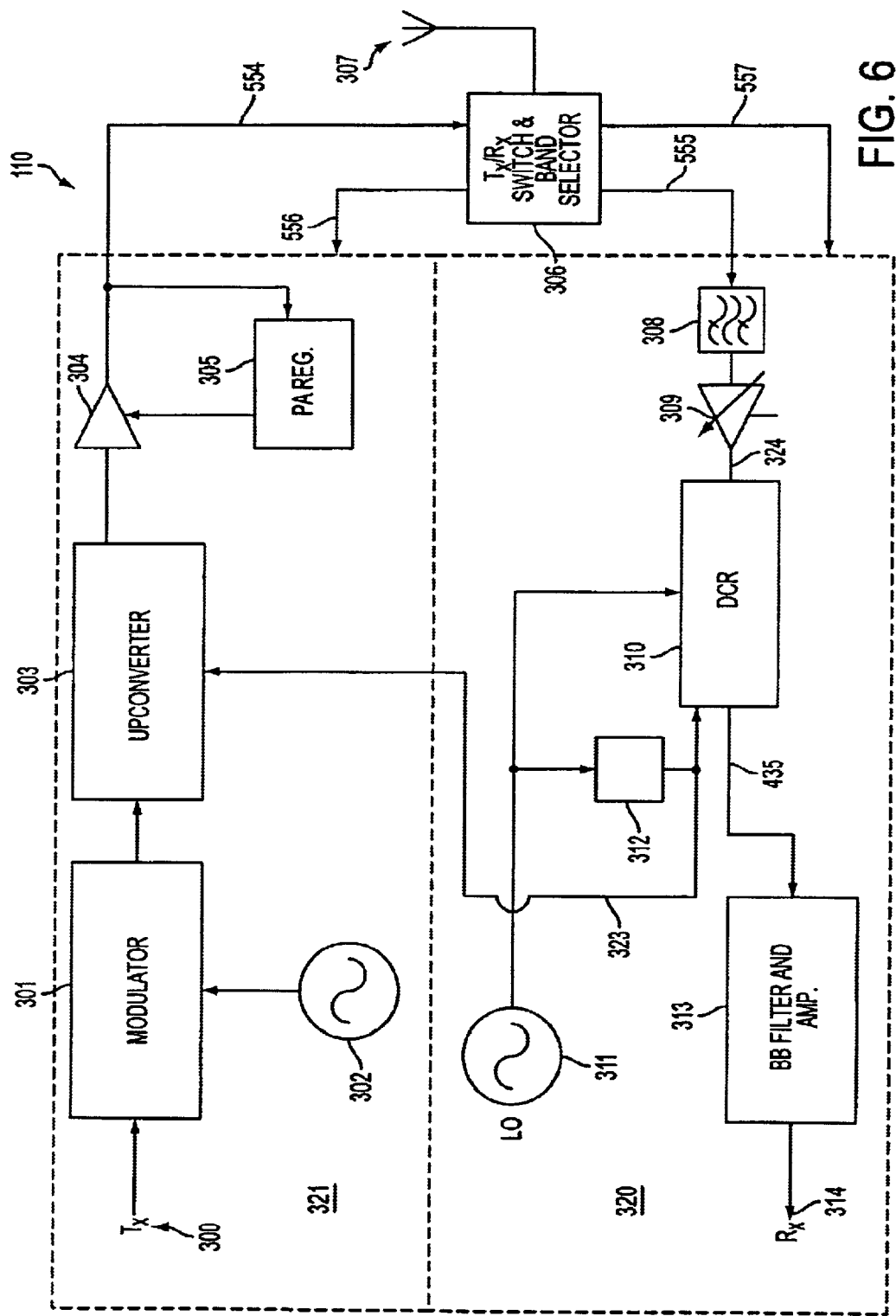
FIG. 6 illustrates a block diagram of a multi-band transceiver in accordance with the subject invention.

FIG. 6 is a general block diagram of a transceiver 110 according to the present invention. Transceiver 110 comprises a receiver portion 320, transmitter portion 321, switch/selector 306, and antenna 307.

The transmitter portion 321 comprises modulator 301, upconverter 303, and carrier input source 302. The receiver portion 320 of the transceiver 110 comprises local oscillator 311, frequency adjuster 312, direct conversion receiver (DCR) 309, bandpass filter 308, low noise amplifier (LNA) 309, and baseband filter and amplifier 313.

The switch/selector 306 is capable of first and second positions depending on the mode of operation of the transceiver 110. In a transmit mode of operation, switch/selector 306 couples the output of PA 304 to antenna 307 over signal line 554. In a receive mode of operation, switch/selector 306 couples the antenna 307 to bandpass filter 308 over signal line 555.

In addition, switch/selector 306 selects, responsive to either a user input or an external signal, the band of operation. Responsive thereto, switch/selector 306, over signal line 556, configures the transmitter portion 321 so that it is compatible with the selected band. In addition, switch/selector 306, over signal line 557, configures the receiver portion 320 so that it is compatible with the selected band.

Modulator 300 receives the baseband signal 300, and uses it to modulate a carrier input provided by carrier input source 302. More specifically, the carrier input is modulated by the baseband signal 300, and the resulting signal is the output of the modulator 301.

The frequency of the carrier input provided by carrier input source 302 is a variable which is determined responsive to the selected band. In one implementation, the frequency is set to the frequency offset of the selected band. Thus, if the selected band is the GSM band, the frequency of the carrier input is selected to be about 45 MHz; if the DCS band, the frequency of the carrier input is selected to be about 95 MHz; and if the selected band is the PCS band, the frequency of the carrier input is selected to be about 80 MHz.

Upconverter 303 receives the output of the modulator and upconverts the frequency thereof to be at the frequency appropriate for transmission, that is, the selected transmit channel within the selected transmit band. Preferably, the upconverter determines the frequency for transmission responsive to a signal 323 derived from the local oscillator 311 included as part of the receiver portion 320 of the transceiver. As will be seen, the frequency of signal 323 is preferably an nth order subharmonic of the selected receive channel of the selected receive band, wherein n is an integer greater than 1.

In one implementation, the upconverter includes a translation loop with a switchable voltage controlled oscillator (VCO) in the loop selectable from a plurality of VCOs, each corresponding to one of the bands handled by the transceiver. In operation, the VCO corresponding to the selected band is itself selected from the plurality of VCOs, and switched so that it is in the signal path extending from the modulator 301 to the switch/selector 306.

The transmitter portion 321 further comprises a power amplifier (PA) 304 for amplifying the output of the upconverter 303 responsive to the output of PA regulator 305. The PA regulator 305 regulates PA 304 responsive to the PA output. More specifically, in one implementation, PA regulator 305 regulates PA 304 so that the output thereof is at a predetermined level. If the level of the output of PA 304 is below the predetermined level, PA regulator 305 boosts the amplification of PA 304 so that the output thereof is at the predetermined level. Conversely, if the level of the output of PA 304 is above the predetermined level, PA regulator 305 lowers the amplification of PA 304 so that the output thereof is again at the predetermined level.

In one implementation, PA 304 is switchable, and selectable from a plurality of PAs, each corresponding to one of the bands handled by the transceiver. In operation, the PA corresponding to the selected band is itself selected from a plurality of PAs, and switched into operation such that it is in the signal path from the modulator 301 to the switch/selector 306.

In the receive mode of operation, the antenna 307 is coupled by switch/selector 306 to bandpass filter 308. A signal is received by the antenna 307 and applied to the bandpass filter 308. In one implementation, the filter 308 is switchable and selectable from a plurality of filters, each having a passband corresponding to one of the bands handled by the transceiver. Thus, in the case in which the GSM band is the selected band, filter 308 is selected such that the passband thereof is generally coincident with the band 925–960 MHz; in the case in which the DCS band is the selected band, filter 308 is selected such that the passband thereof is generally coincident with the band 1805–1880 MHz; and in the case in which the PCS band is the selected band, filter 308 is selected such that the passband thereof is generally coincident with the band 1930–1990 MHz. In operation, the filter 308 corresponding to the selected band is switched into the signal path between the baseband filter/amplifier 313 and the switch/selector 306.

The output of bandpass filter 308 is coupled to low noise amplifier (LNA) 309. In one implementation, LNA 309 is switchable and selected from a plurality of LNAs, each corresponding to one of the bands handled by the transceiver. In operation, the LNA corresponding to the selected band is itself selected, and switched into service such that it is within the signal path from the baseband filter/amplifier 313 and the switch/selector 306.

3. Frequency Translator

Figure 7:
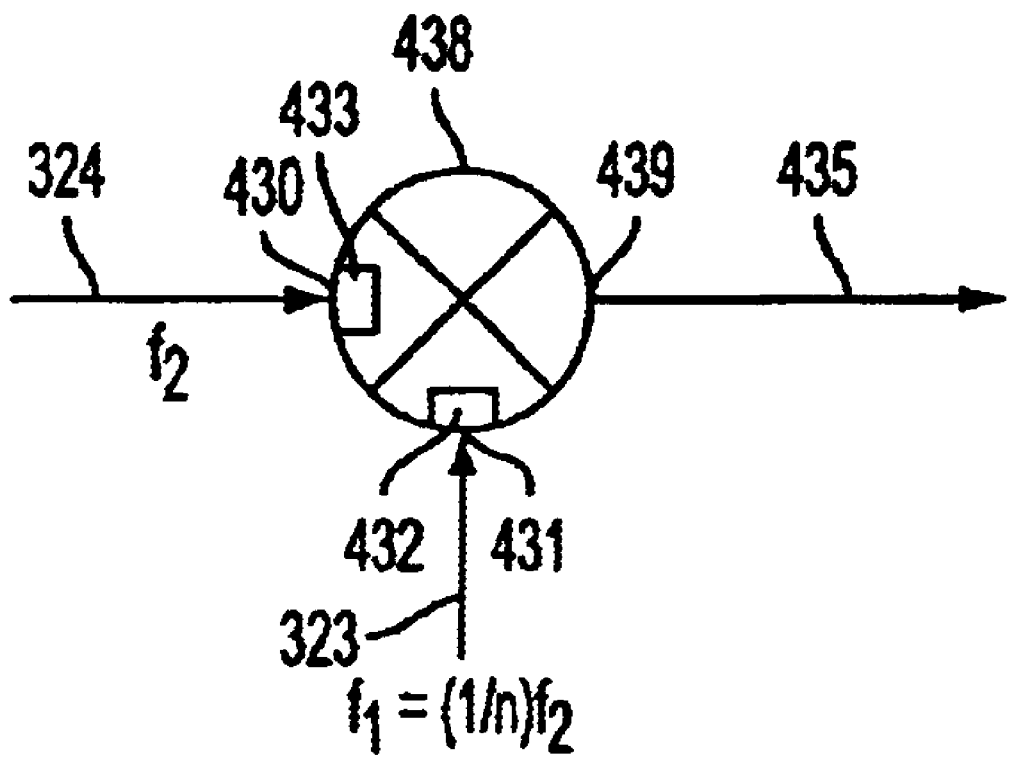
FIG. 7 illustrates a direct conversion receiver frequency translator in accordance with the subject invention.

The output of LNA 309 is coupled to direct conversion receiver (DCR) 310. Direct conversion receiver 310 includes a frequency translator of the type shown in FIG. 7 and identified with numeral 438. As illustrated in FIG. 7, frequency translator 438 has first and second input ports, identified respectively with numerals 431 and 430. A first filter 432 is coupled to the first port 431, and a second filter 433 is coupled to the second port 430. Preferably, the filters are integral with or inherent to the ports so that the frequency translator lacks exposed unfiltered ports. A signal 323 derived from the output of the local oscillator 311 is coupled to the first filtered port 431 of frequency translator 438. More specifically, the output of local oscillator 311 is provided to frequency adjuster 312, which is configured to adjust the frequency of the signal output from the local oscillator 311. Local oscillator 311 is tunable responsive to the selected channel in the selected receive band. In one implementation, the frequency adjuster 312 is configured to adjust the frequency of the output of the local oscillator 311 by either multiplying or dividing the frequency of that output by m, where m is an integer greater than or equal to 1, determined responsive to the selected band.

The frequency $f_1$ of the signal 323 is set through suitable tuning of the local oscillator 311, and adjustment of the frequency adjuster 312, such that the signal 323 is about an nth order subharmonic (wherein n is an integer greater than 1) of the carrier frequency $f_2$ of the signal 324, that is, the selected channel within the selected receive band. That is to say, $f_1 \cong (1/n)f_2$, wherein n is an integer greater than 1. Signal 324 is applied to the second filtered port 430 of the frequency translator 438.

The first filter 432 is preferably a low pass filter having a corner frequency which is below the selected receive band, including $f_2$, and above the frequency $f_1$, the nth order subharmonic of $f_2$. In other words, the corner frequency is set above $f_1$ and below $f_2$. The difference between $f_2$ and $(1/n)f_2$ is such that a substantial level of attenuation can be achieved by filter 432 of leakage onto port 431 at the frequency $f_2$. Advantageously, the level of attenuation is 88 dB or more, consistent with current GSM isolation requirements.

Similarly, the second filter 433 is preferably a high pass filter having a corner frequency which is below the selected receive band, including $f_2$, and above the frequency $f_1$, the nth order subharmonic of $f_2$. The difference between $f_2$ and $(1/n)f_2$ is such that a substantial level of attenuation can be achieved by filter 433 of leakage onto port 433 at the frequency $f_1$. Advantageously, the level of attenuation is 88 dB or more, consistent with current GSM isolation requirements.

Through operation of these filters, the effects of leakage between the first and second ports of the frequency translator are eliminated or reduced. Leakage from the first port to the second port will be at the frequency $f_1$, and thus attenuated by filter 433. Moreover, this leakage will be prevented from radiating out through antenna 307 by the bandpass filter 308. Similarly, leakage from the second port to the first port will be at the frequency $f_2$, and thus attenuated by filter 432.

In one embodiment, the frequency translator 438 is a multiplier configured to multiply the signals at the first and second input ports thereof. In a second embodiment, frequency translator 438 is a mixer configured to switch the second input to the output through a switching action which occurs at a switching or sampling rate of n times the frequency $f_1$ of the signal applied to the first input 431 of the mixer, wherein n is an integer greater than 1. By switching at n times the frequency $f_1$, the mixer conserves frequency in that more energy is packed into the baseband component of the output of the mixer than if the switching action were performed at the frequency $f_1$.

Figure 15A:
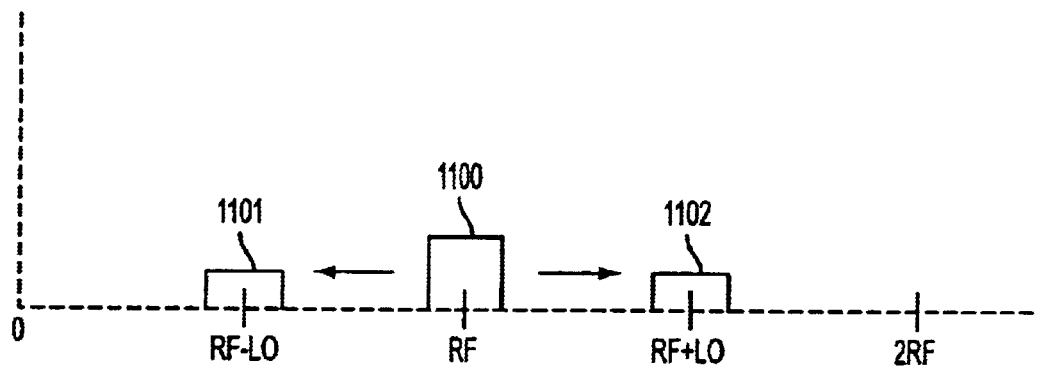
FIG. 15 illustrates, in the frequency domain, operation of a frequency translator in accordance with the subject invention.
Figure 15B:
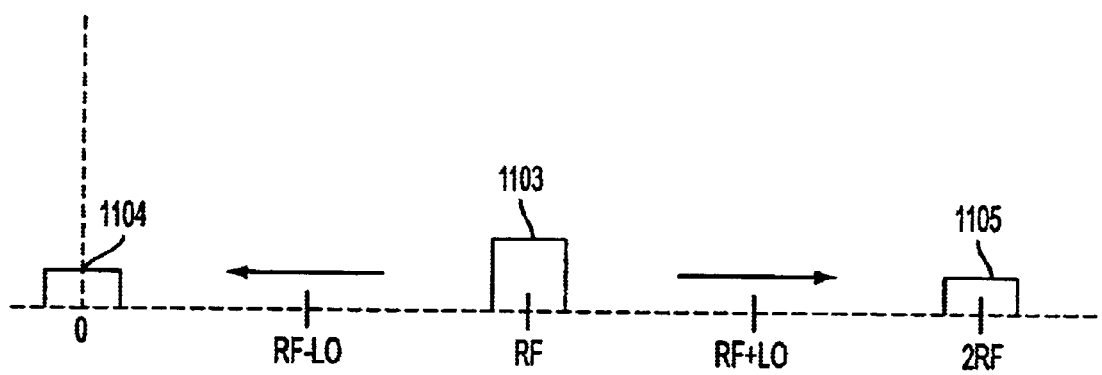

Such is illustrated in FIGS. 15A–B in relation to an implementation of frequency translator 438 in which the frequency translator 438 is a mixer having LO and RF input ports, and in which a procedure known as half-frequency injection is utilized. According to this procedure, the frequency $f_{LO}$ of the signal applied to the LO input port is about ½ the frequency $f_{RF}$ of the signal applied to the RF input port, and the mixer switches at twice $f_{LO}$.

FIG. 15A illustrates the effect if the mixer had switched at the frequency $f_{LO}$. The energy 1100 of the incoming signal at the frequency $f_{RF}$ is principally split between a component 1101 at the frequency $f_{RF}-f_{LO}$, and a component 1102 at the frequency $f_{RF}+f_{LO}$. As can be seen, little or no energy is provided at baseband frequencies, that is, low frequencies centered about 0 Hz. The foregoing is also demonstrated by the following mathematical identity:

$$(A\cos 2\pi f_{RF}t) \times (B\cos 2\pi f_{LO}t) = 1/2AB[\cos 2\pi (f_{RF}-f_{LO})t] + 1/2AB[\cos 2\pi (f_{RF}+f_{LO})t]$$

Since $f_{LO} \cong 1/2 f_{RF}$, the first of the foregoing components is about at the frequency $1/2f_{RF}$ or $f_{LO}$, while the second of the foregoing components is about at the frequency $3/2f_{RF}$ or $3f_{LO}$. As can be seen, there are no first order components at baseband frequencies.

FIG. 15B illustrates the effect of switching at twice the frequency $f_{LO}$. As can be seen, the energy 1103 of the incoming signal at the frequency $f_{RF}$ is principally split between a component 1104 at baseband frequencies, and a component 1105 at the frequency $2f_{RF}$. As can be seen, a substantial baseband component is introduced by switching the mixer at the frequency $2f_{LO}$.

Figure 17:
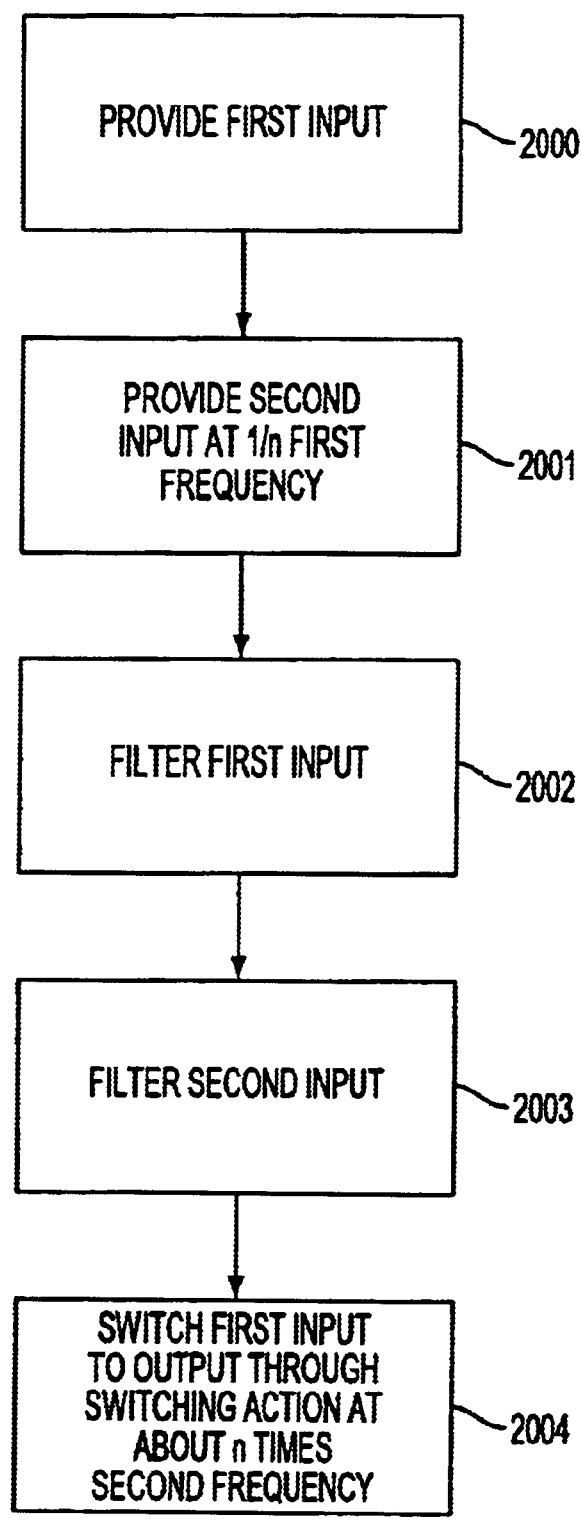
FIG. 17 is a flowchart illustrating one embodiment of a method of operation of a direct conversion receiver in accordance with the subject invention.

A method of operation of a frequency translator in accordance with the subject invention is illustrated in FIG. 17. As indicated, in step 2000, a first input signal is provided at a first frequency, and in step 2001, a second input signal is provided at a second frequency which is about 1/n times the frequency of the first input signal, wherein n is an integer greater than 1. In step 2002, the first input signal is filtered to substantially attenuate any components at the second frequency, and in step 2003, the second input signal is filtered to substantially attenuate any components at the first frequency.

In step 2004, the filtered first signal is frequency translated by switching this signal to an output through a switching action which is performed at n times the second frequency. In one implementation, the output which results is representative of the product of a multiplication factor which switches at n times the second frequency and the filtered first signal.

As discussed, in one implementation, the frequency translator is a mixer wherein the first input thereof is the LO input of the mixer, and the second input thereof is the RF input of the mixer. In one implementation example, in accordance with half-frequency injection, the LO frequency applied to the LO input of the mixer is about ½ the RF frequency applied to the RF input of the mixer.

The operation in the time domain of implementations of frequency translators in accordance with the subject invention can be explained further with reference to FIGS. 11A–11F. FIG. 11A is an example of a LO signal applied to the LO input of the frequency translator, and FIG. 11C is an example of a RF signal applied to the RF input of the frequency translator. As can be seen, in this embodiment, the frequency of the LO signal is about ½ that of the RF signal.

FIG. 11B is a multiplication factor which defines, in one implementation, the transfer function between the incoming RF signal of FIG. 11C and the output signal, illustrated in FIG. 11D. As can be seen, the frequency of the switching action of the multiplication factor is twice that of the LO frequency. The product of the multiplication factor and the RF signal defines, in one implementation, the output signal of FIG. 11D.

Figure 12A:
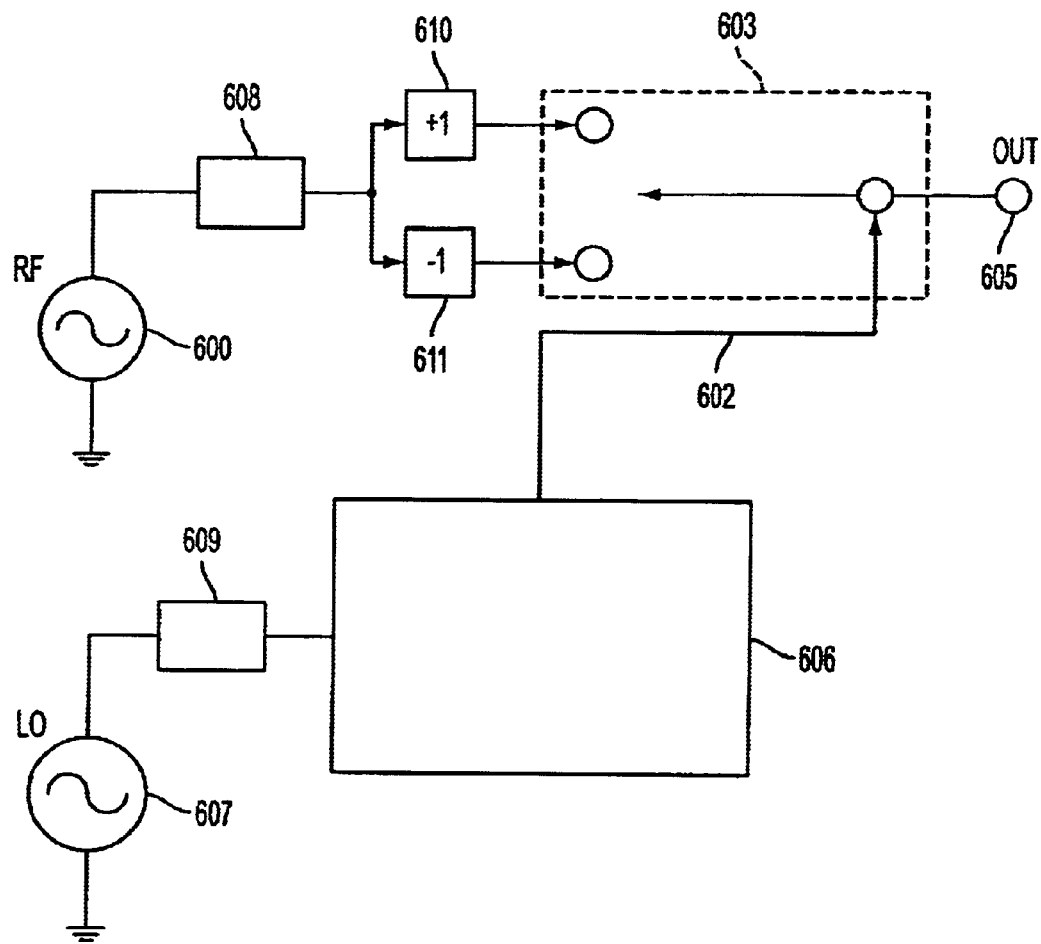
FIGS. 12A–12B are a block diagrams of frequency translators in accordance with the subject invention.

FIG. 12A illustrates a block diagram of this implementation of a frequency translator. In this implementation, LO source 607 is coupled to low-pass filter (LPF) 609, and RF source 600 is coupled to high-pass filter (HPF) 608. The output of LPF 609 is input to circuit block 606, which controls SPDT switch 603 through signal line 602, causing it to switch at a frequency which is twice the LO frequency.

The output of HPF 408 is coupled to +1 multiplication block 610 and −1 multiplication block 611. When the switch 603 is in the up position, the output of +1 multiplication block 610 is provided to the output 605, and when the switch is in the down position, the output of −1 multiplication block 611 is provided to the output 605. Consequently, a signal is produced at output 605 which is representative of the product of a multiplication factor, which switches between +1 and −1 at a frequency which is twice the LO frequency, and the filtered RF signal output from HPF 608.

It is important to note that a signal at the frequency of the multiplication factor is not actually produced as a signal at a pin or node of the mixer. As one of skill in the art would appreciate, it would be counterproductive to actually produce such a signal on a pin or node of the mixer since the objective of this implementation is to prevent self-mixing of the LO signal, and production of a signal at a pin or node at twice the LO frequency would defeat that objective. Instead, in this implementation, the multiplication factor simply represents (1) a switching action which occurs at about twice the LO frequency; and (2) the transfer function between the incoming filtered RF signal and the output signal.

FIGS. 11E and 11F illustrate an example of a differential output signal provided in another implementation of a frequency translator of the subject invention. The LO input to the frequency translator in this example is assumed to be the signal illustrated in FIG. 11A, and the RF input to the frequency translator in this example is assumed to be the signal illustrated in FIG. 11C. In this implementation, the differential output signal has a positive phase component, OUT+, which is illustrated in FIG. 11E, and a negative phase component, OUT−, which is illustrated in FIG. 11F. As illustrated, the difference between OUT+ and OUT− in this example is identical to the signal OUT illustrated in FIG. 11D in relation to the other implementation.

Figure 12B:
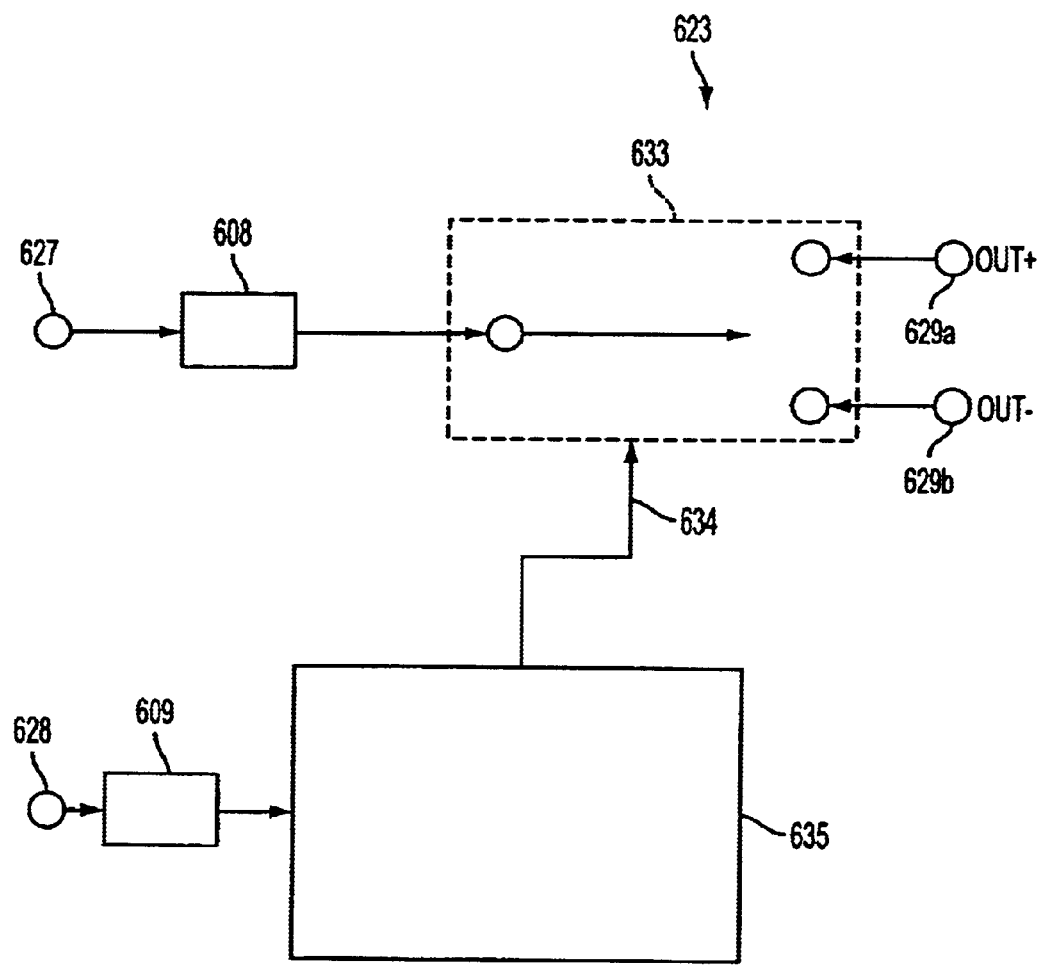

FIG. 12B is a block diagram of the foregoing implementation of a frequency translator in which a differential mode output is provided. Compared to FIG. 12A, like elements are identified with like reference numerals in FIG. 12B. As illustrated, input port 627 is provided to receive an RF signal, and input port 628 is provided to receive an LO signal. The frequency of the LO signal in this implementation is assumed to be about ½ the frequency of the RF signal.

HPF 608 is configured to filter the RF input signal, and LPF 609 is configured to filter the LO input signal, in the manner described previously. The output of LPF 609 is provided as an input to circuit block 635, which controls SPDT switch 633 through signal line 634. SPDT switch 633 is configured to alternate, at a frequency about twice the frequency of the LO input, between switching the filtered RF input to the positive phase component of the output, OUT+, and the negative phase component of the output, OUT−. The signals illustrated in FIGS. 11D–11E are examples of signals that result from this operation.

Comparing the implementation examples of FIGS. 12A–12B, it can be seen that both switch the RF input to an output, whether single-ended or a differential mode output, through a switching action which occurs at about the LO frequency.

Figure 16:
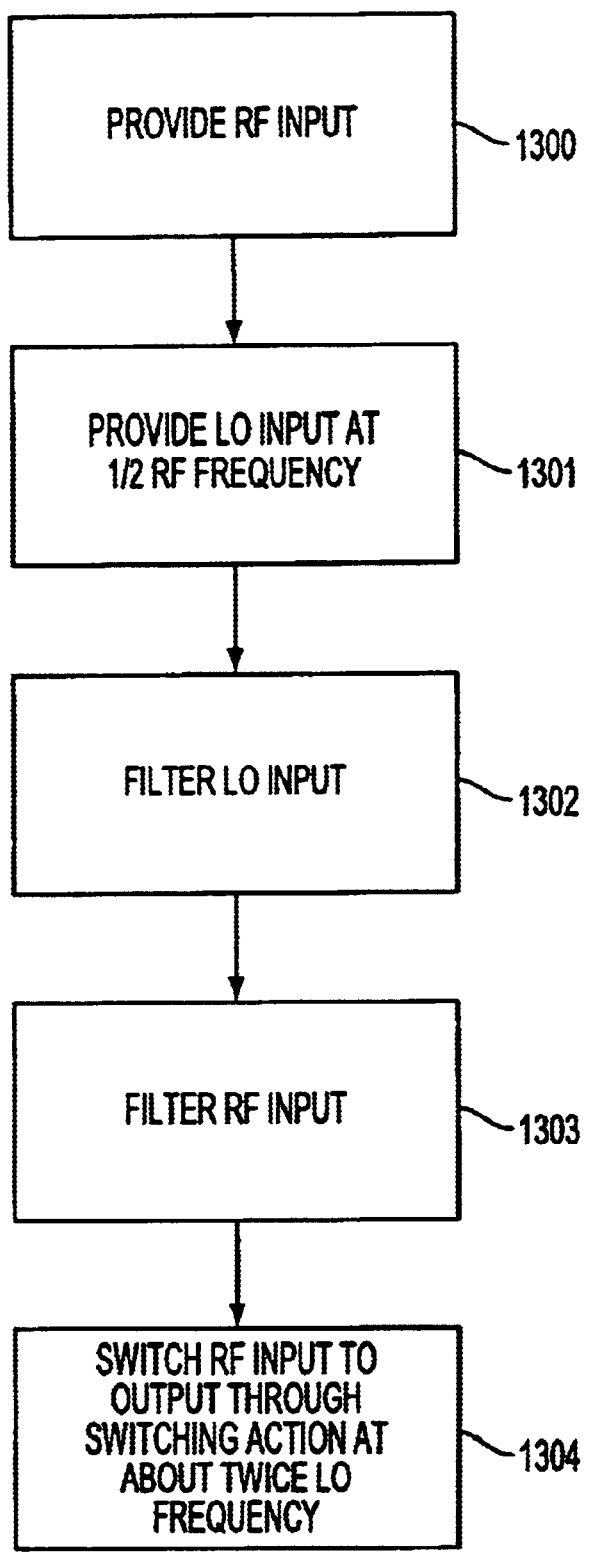
FIG. 16 is a flowchart illustrating one implementation of a method of operation of a direct conversion receiver in accordance with the subject invention.

It should be appreciated that the implementation examples illustrated in FIGS. 12A–12B are easily generalizeable to the case in which the LO input is about an nth order subharmonic of the RF input, where n is any integer greater than 1. In that case, the frequency of the LO input is about 1/n times the frequency of the RF input, and the frequency of the switching action which is represented by SPDT switches 603 and 633 is increased to be n times the frequency of the LO input. A method of operation of one implementation of a frequency translator in accordance with the subject invention is illustrated in FIG. 16. As illustrated, in step 1300, an RF input is provided, and in step 1301, an LO input is provided at a frequency which is about ½ of the RF frequency. In step 1302, the LO signal is filtered to substantially filter out any components at the RF frequency. In step 1303, the RF signal is filtered to substantially filter out any components at the LO frequency. In step 1304, the filtered RF signal is frequency translated by switching it to an output through a switching action which occurs at twice the LO frequency. In one implementation example, the resulting output signal is representative of the product of a multiplication factor, which switches between +1 and −1 at a frequency which is twice the LO frequency, and the filtered RF signal.

As discussed previously, the multiplication factor does not represent an actual signal produced by the frequency translator of the subject invention. Instead, it simply represents, in one implementation, the switching action which occurs within the frequency translator and also represents, in one implementation, the transfer function between the incoming RF signal and the output signal.

Figure 13:
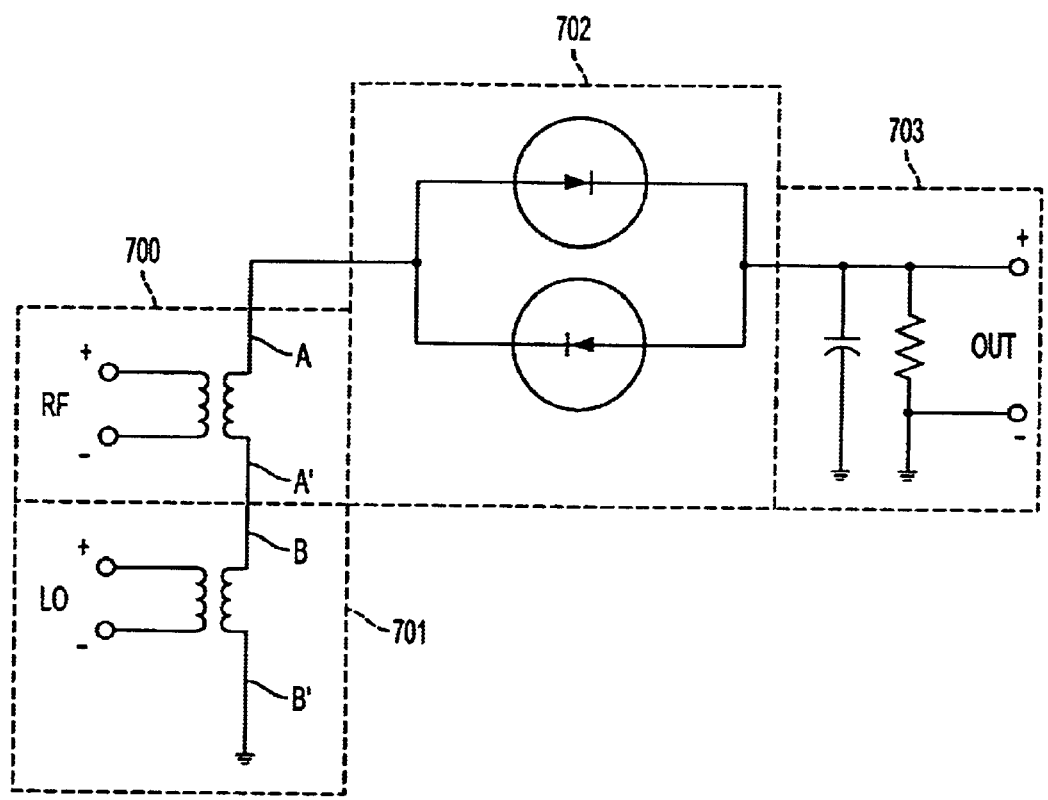
FIG. 13 is an implementation example of a frequency translator in accordance with the subject invention.

An implementation example of a mixer utilizing half-frequency injection in accordance with one embodiment of the subject invention is illustrated in FIG. 13. The mixer in this example comprises RF input block 700, LO input block 701, diode block 702, and output block 703. As shown, the RF and LO input blocks are coupled through a series connection to diode block 702, which comprises two diodes coupled back-to-back. The output of the diode block is then coupled to output block 703 which, in this example, includes a low pass filter to low pass filter the output of the diode block. In this example, since the LO frequency is about ½ of the RF frequency, a switching action is provided at twice the LO frequency by the diode block 702.

FIGS. 18A–18C illustrate simulated waveforms for this implementation example. FIG. 18A illustrates the LO signal provided as an input to block 701;

FIG. 18B illustrates the RF signal provided as an input to block 700; and FIG. 18C illustrates the output signal provided as an output from block 703. As can be seen, the output signal has a component at the LO frequency, and a low frequency component. The low frequency component is the desired signal. In an actual implementation, the low pass filter in output block 703 would be configured to filter out the LO frequency component.

Figure 14A:
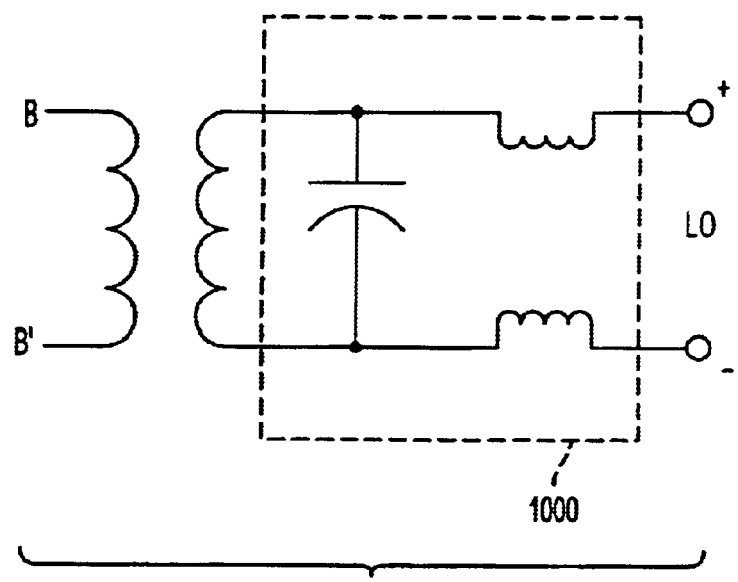
FIGS. 14A–14B are implementation examples of the filters integral or inherent to the input ports of a frequency translator in accordance with the subject invention.
Figure 14B:
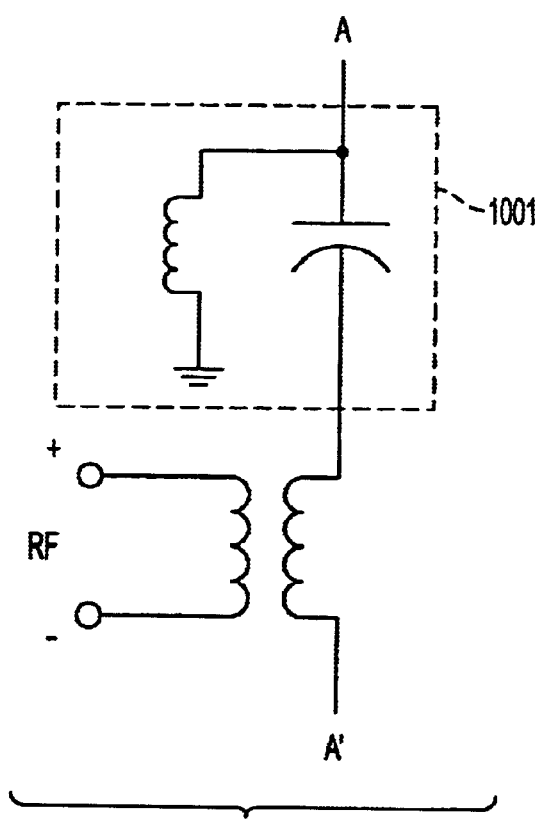

An implementation example of RF and LO input blocks incorporating filters to reduce the effects of leakage between the RF and LO inputs is illustrated in FIGS. 14A–14B. FIG. 14A illustrates an LO input block integrated with a low-pass filter configured to substantially eliminate RF frequencies. It can replace the LO input block in the foregoing mixer example of FIG. 13 at the line B–B' there illustrated.

FIG. 14B illustrates an RF input block integrated with a high pass filter configured to substantially eliminate LO frequencies. It can replace the RF input block in the foregoing mixer example of FIG. 13 at the line A–A' there illustrated.

4. Transceiver—Detailed Discussion

Turning back to FIG. 6, in one implementation, DCR 310 is switchable and selectable from a plurality of DCRs, each corresponding to one of the bands handled by the transceiver. More specifically, in this implementation, the corner frequency of the LPF coupled to the first input port of the frequency translator in a DCR, and that of the HPF coupled to the second input port of the frequency translator in the DCR, is below the band corresponding to the DCR and above the nth subharmonic of the band, wherein n is an integer greater than 1. In operation, the DCR corresponding to the selected band is selected and switched such that it is in the signal path from the baseband filter 313 and the switch/selector 306.

A method of operation of the transciever 110 of FIG. 6 will now be described. First, a receive band is selected, and a channel within the receive band is also selected. The local oscillator 311 is then tuned and/or the frequency adjuster 312 is adjusted such that the frequency of the signal 323 is set to an nth order subharmonic of the selected receive channel frequency, wherein n is an integer greater than 1. Meanwhile, in one implementation, the frequency of the carrier input source 302 is set so that it is about equal to the frequency offset for the selected band.

Figure 3:
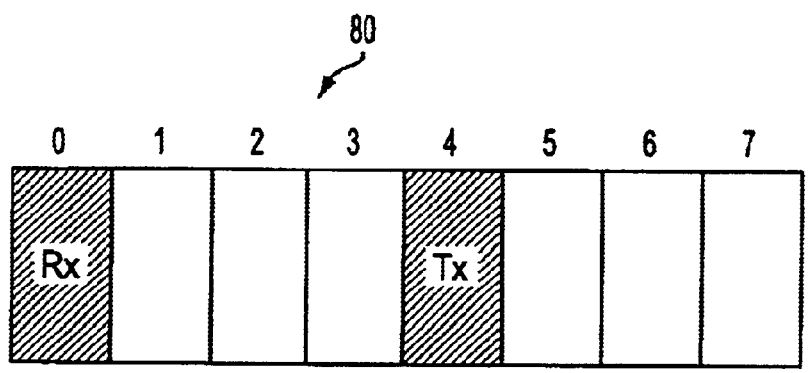
FIG. 3 illustrates the format of a conventional TDMA frame.
Figure 4:
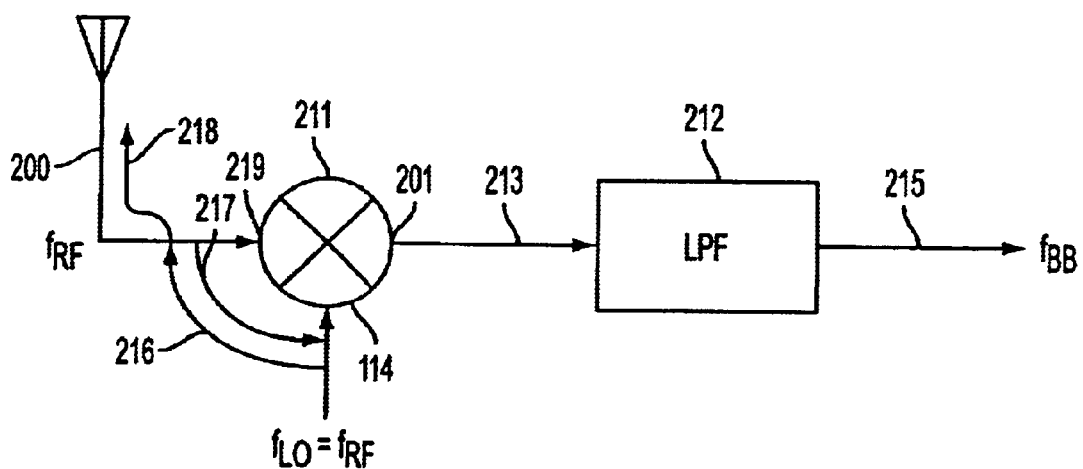
FIG. 4 illustrates a conventional direct conversion receiver.

Operation then switches back and forth between a transmit mode of operation and a receive mode of operation, with the frequency sufficient to support full-duplex transmission, that is, concurrent transmission and reception. Assuming the TDMA frame format of FIG. 3 is applicable, in which each time slot is 0.577 mS in duration, and there are four receive time slots followed by four transmit time slots, the transceiver 110 will switch back and forth between the transmit and receiver modes every 2.308 mS.

In the receive mode of operation, a signal is received from antenna 307 and bandlimited by bandpass fillter 308 so that is limited to the selected band. The signal is amplified by LNA 309 and then input to DCR 310. DCR 310 downconverts the signal 324 to baseband frequencies in a single step. The resulting output signal 435 from DCR 323 is then passed through baseband filter and amplifier 313. The result is the baseband receive signal 314.

In the transmit mode of operation, the baseband transmit signal 300 is used to modulate a carrier signal provided by carrier input source 302. In one implementation, the carrier signal is at about the frequency offset for the selected band. The resulting output signal is then upconverted to the transmit frequency by upconverter 303 responsive to the signal 323 output from frequency adjuster 312. In one implementation, the transmit frequency $f_4$ bears the following relationship to n, the order of subharmonic represented by $f_1$, the frequency of signal 323, $f_1$, and $f_3$, the frequency of the signal provided by carrier input source 302: $f_4 \cong nf_1-f_3$. The resulting signal, after amplification by power amplifier 305, is then transmitted by antenna 307.

Although carrier input source 302, modulator 301, and upconverter 303 are shown as separate blocks or elements in FIG. 6, it should be appreciated that embodiments are possible in which one or more of these elements or blocks are combined together. For example, configurations are possible in which upconverter 303 comprises a translation loop, and modulator 301 and carrier input source 302 are included within the translation loop.

Figure 8:
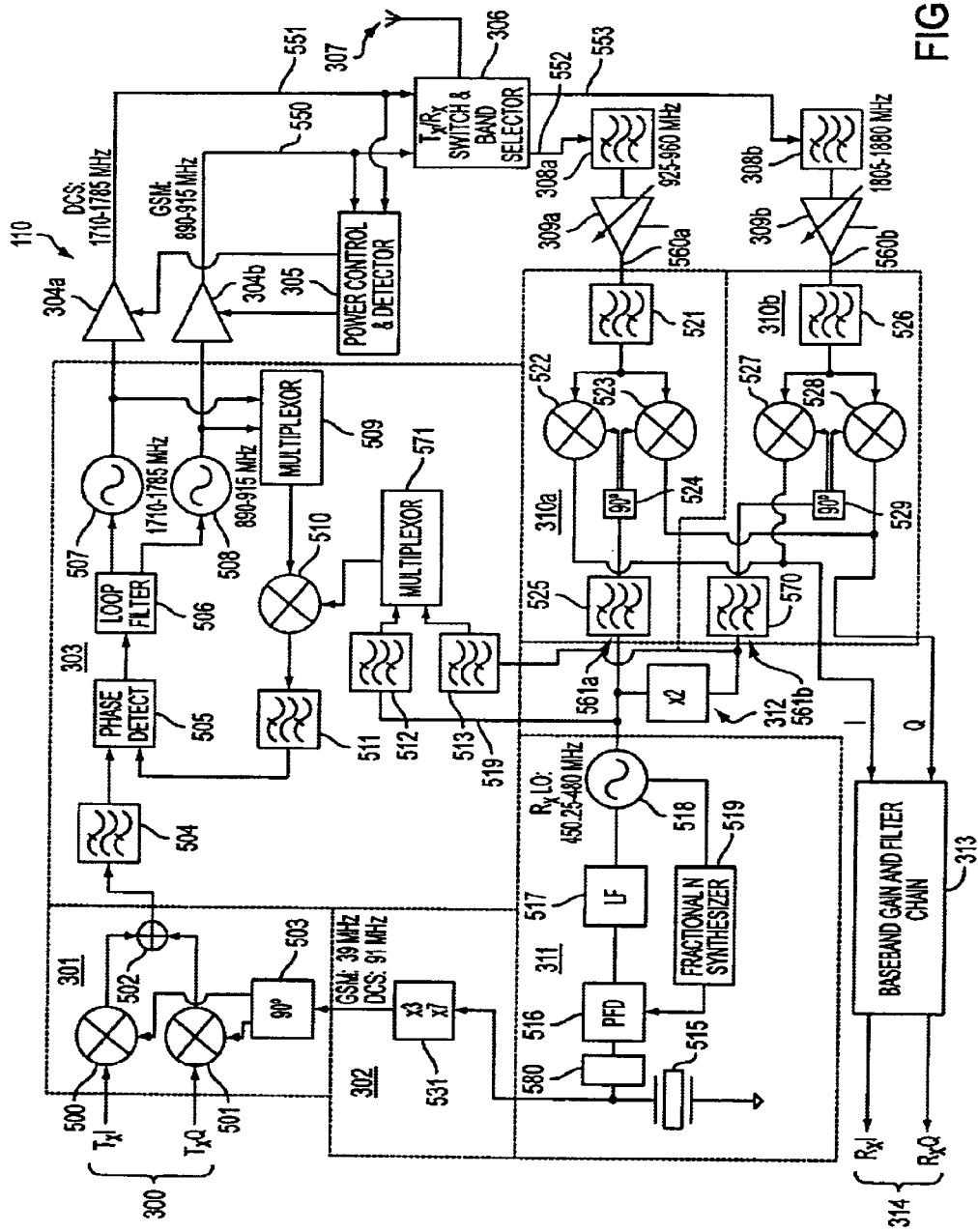
FIG. 8 illustrates a first implementation of the subject invention.

A first implementation of a transceiver in accordance with the subject invention is illustrated in FIG. 8 in which, compared to FIG. 6, like elements are referenced with like identifying numerals. This implementation is configured to handle full duplex communication in the GSM and DCS bands.

In this implementation, element 306 comprises a $T_x/R_x$ switch 306 integrated with a band selector. Element 306 functions to couple antenna 307 to signal line 550 if a transmit mode of operation for the GSM band is selected; to signal line 551 if a transmit mode of operation for the DCS band is selected; to signal line 552 if the receive mode for the GSM band is selected; and to signal line 553 if the receive mode for the DCS band is selected.

The receive portion of the transceiver comprises local oscillator 311, doubler 312, DCRs 310a and 310b, LNAs 309a and 309b, bandpass filters 308a and 308b, and baseband gain and filter chain 313. The transmit portion of the transceiver comprises low frequency offset source 302, quadrature modulator 301, translation loop upconverter 303, Pas 304a and 304b, and power control and detector 305.

Local oscillator 311 comprises a phase-locked loop (PLL) which includes a crystal oscillator 515 as the source of the reference frequency, a reference divider 580, a phase-frequency detector (PFD) 516, a loop filter 517, a voltage-controlled oscillator (VCO) 518, and fractional N synthesizer 529. The crystal oscillator in this implementation provides an output at 13 MHz. The reference divider 580 is configured to divide by 13. The loop filter 517 is configured to achieve a given lock range and/or damping factor in accordance with known techniques. The VCO is configured to provide an output signal having a frequency which ranges from 450.25 MHz–480 MHz in 50 kHz increments, generally equal to about ½ of the GSM receive band or about ¼ of the DCS receive band.

The fractional N synthesizer includes a dual modulus counter set to divide by any number in the range of 450.25 to 480 in increments of 0.05. Preferably, the synthesizer includes a dual modulus counter which divides by a weighted average of N and N+1, with the weighting specified by the parameters A and B in accordance with the formula:

$$\left(\left(\frac{A}{A+B}\right)\times N\right)+\left(\left(\frac{B}{A+B}\right)\times (N+1)\right)$$

Thus, to obtain a divide ratio of 450.35, N would be set equal to 450, A to 65, and B to 35. The frequency of the output of VCO 518 is the product of this divide ratio and the reference frequency of 1 MHz. In operation, the values of N, A, and B are set responsive to the selected channel. In the case in which the selected band is the GSM band, these parameters are set so that the output of the VCO is about ½ of the channel frequency. In the case in which the selected band is the DCS band, these parameters would be set so that the output of the VCO is about ¼ of the channel frequency.

The output of VCO 518 on signal line 519 is provided to frequency doubler 312. It is also provided to the LO input 561a of DCR 310a. It is further provided as an input to filter 512 of translation loop upconverter 303. Frequency doubler 312 doubles the frequency of the output of VCO 518, and provides the same to the LO input 561b of DCR 310b, and to the input of filter 513 of translation loop upconverter 303.

DCRs 310a and 310b are both direct conversion receivers of the type discussed previously. Both have LO inputs, respectively identified with numerals 561a and 561b, and RF inputs, respectively identified with numerals 560a and 560b. LPF 525 is integral with the LO input 561a of DCR 310a, and LPF 570 is integral with the LO input 561b of DCR 310b. In one implementation example, LPF 525 has a corner frequency of 500 MHz, and LPF 570 has a corner frequency of 1 GHz. HPF 521 is integral with the RF input 560a of DCR 310a, and HPF 526 is integral with the RF input 560b of DCR 310b. In one implementation example, the corner frequency of HPF 521 is 0.85 GHz, and the corner frequency of HPF 526 1.7 GHz.

Both are implemented as quadrature demodulators. Thus, DCR 310a includes two mixers, 522 and 523, and DCR 310b includes two mixers, 527 and 528. Each of these mixers has an LO input and an RF input, and each is configured to switch at twice the frequency of the signal provided at the LO input. The LO input of mixer 522 is derived from the output of VCO 518. The signal applied to the LO input of mixer 522 is phase shifted by 90° by phase-shifter 524, and then provided as the LO input to mixer 523. The output of mixer 522 is the 1 input to baseband gain and filter chain 313 when the GSM band is selected.

The signal applied to the LO input to mixer 527 is derived from the output of doubler 312. This signal is phase shifted by 90° by phase shifter 529, and applied to the LO input of mixer 528. The output of mixer 527 becomes the 1 input to baseband gain and filter chain 313, and the output of mixer 528 becomes the Q input thereof, in the case in which the DCS band is the selected band.

Signal line 552 from element 306 is input to bandpass filter 308a, which has a passband generally coincident with the GSM receive band. In one implementation example, the passband of filter 308a is the GSM receive band of 925–960 MHz. The output of filter 308a is provided as an input to LNA 309a, which is suitable for use with the GSM band. The output of LNA 309a is applied to the RF input 560a of DCR 310a.

Signal line 553 from element 306 is input to bandpass filter 308b, which has a passband generally coincident with the DCS receive band of 1805–1880 MHz. The output of filter 308b is provided as an input to LNA 309b, which is suitable for use with the DCS band. The output of LNA 309b is applied to the RF input 560b of DCR 310b.

Low frequency offset (LCO) source 302 comprises a frequency frequency translator 531 which provides a carrier input to quadrature modulator 301 at a frequency of 39 MHz in the case in which the selected band is GSM, and 91 MHz in the case in which the selected band is DCS. The 39 MHz frequency is obtained by multiplying the 13 MHz crystal oscillator frequency by 3. The 91 MHz frequency is obtained by multiplying the 13 MHz crystal oscillator frequency by 7. These frequencies are about equal to the frequency offsets between the transmit and receive channels for the selected band, 45 MHz in the case of GSM, and 95 MHz in the case of DCS.

Quadrature modulator 301 comprises mixers 500 and 501, summer 502, and phase shifter 503. Mixer 500 receives the I component of the baseband signal 300 to be transmitted, and multiplies it by the signal provided by LCO source 302. Mixer 501 receives the Q component of the baseband signal 300 to be transmitted, and multiplies it by a 90° phase-shifted version of the signal output from LCO source 302. This phase shifted signal is provided by phase shifter 503. The outputs of the two mixers are added by summer 502 to form the output signal of the quadrature modulator 301.

The output of the quadrature modulator 301 is then provided as an input to translation loop upconverter 303. Translation loop upconverter 303 comprises filter 504, phase detector 505, loop filter 506, VCO 507, VCO 508, multiplexor 509, downconversion mixer 510, and filters 511, 512, and 513.

The output of quadrature modulator 301 is provided as an input to filter 504. Filter 504 functions to suppress the third harmonic of the transmission intermediate frequency. The output of filter 504 is provided as an input to phase detector

505. The other input to phase detector 505 is the output of filter 511. Phase detector 505 compares the phase of the signals provided at its two inputs, and outputs a signal having a magnitude proportional to the phase difference between the two input signals. The output of phase detector 505 is filtered by loop filter 506, and then provided as an input to VCOs 507 and 508.

VCO 507 is configured to output a signal having a frequency in the range of the DCS transmit band, 1710–1785 MHz, with the precise output frequency being determined responsive to the signal output from filter 507. VCO 508 is configured to output a signal having a frequency in the range of the GSM transmit band, 890–915 MHz, with the precise output frequency being determined responsive to the signal output from filter 507.

The outputs of VCOs 507 and 508 are input to multiplexor 509 which selects one of these two signals based on which band is the selected band, and applies the selected signal to the RF input of mixer 510. If the DCS band is the selected band, the output of VCO 507 is selected; if the GSM band is the selected band, the output of VCO 508 is selected.

Filter 512 is a low pass filter which receives as an input the output of VCO 518. In one implementation example, the corner frequency of filter 512 is 500 MHz. Filter 513 is a low pass filter which receives as an input the output of doubler 312. In one implementation, the corner frequency of filter 513 is 1 GHz The outputs of filters 512 and 513 are input to multiplexor 571 which selects one of these inputs based on which band is the selected band, and applies the selected signal to the RF input of mixer 510. The filters 512 and 513 are integral with the RF input of mixer 510 so that mixer 510 lacks any exposed unfiltered ports. Mixer 510 is configured to switch at twice the frequency of the signal provided at the LO input thereof. If the GSM band is the selected band, the output of filter 512 is provided to the LO input of mixer 510. If the DCS band is the selected band, the output of filter 513 is provided to the LO input of mixer 510.

The frequency of the signal applied to the LO input of mixer 510 is about ½ the selected receive channel frequency for the selected band. More specifically, in the case in which DCS is the selected band, the LO frequency is set to ($F_{TX}$+91 MHz)/2. In the case in which GSM is the selected band, the LO frequency is set to ($F_{TX}$+39 MHz)/2. The output of mixer 510 will have two principal components, one at about the low frequency offset for the selected band, and the other at a much higher frequency. Filter 511 is a filter which receives the output of mixer 510 and attenuates the higher frequency component. The remaining component, at about the frequency offset for the selected band, is provided as an input to phase detector 505.

In the case in which the DCS band is the selected band, the output of VCO 507 is at the frequency of the selected transmit band, which is the selected receive band minus the frequency offset for the selected band. The output of VCO 507 is provided as an input to PA 304a. Power control and detector 305' controls the level of amplification provided by PA 304a so that the power of the signal output by PA 304a is at a predetermined level. The output of PA 304a is then provided as an input to element 306 over signal line 551. Element 306, as discussed, coupled signal line 551 to antenna 307 in the case in which the selected band is the DCS band, and the transmit mode of operation is in effect.

In the case in which the GSM band is the selected band, the output of VCO 508 is at the frequency of the selected transmit band, which is the selected receive band minus the frequency offset for the selected band. The output of VCO 508 is provided as an input to PA 304b. Power control and detector 305 controls the level of amplification provided by PA 304b so that the power of the signal output by PA 304b is at a predetermined level. The output of PA 304b is then provided as an input to element 306 over signal line 550. Element 306, as discussed, couples signal line 550 to antenna 307 in the case in which the selected band is the GSM band, and the transmit mode of operation is in effect.

The general operation of the implementation of FIG. 8 will now be described. The receive mode of operation will first be described, followed by the transmit mode of operation.

In the case in which the selected band is the GSM band, the division ratio of the fractional N synthesizer 519 is set such that the output of VCO 518 is at a frequency which is about ½ the selected receive channel frequency.

A signal is received over antenna 307 and provided to filter 308a by element 306. Filter 308a bandlimits the signal so that it is within the GSM receive band of 925–960 MHz, and LNA 309a amplifies the signal. DCR 310a downconverts the signal to baseband frequencies in a single step while filters 521 and 525 suppress the effects of any leakage between the LO and RF inputs of the mixers 522 and 523. These mixers function by switching at twice the frequency applied to the LO inputs thereof, which is about the selected channel frequency.

The resulting I and Q signals are input to baseband gain and filter chain 313 which attenuates the components of the I and Q signals at twice the selected channel frequency, leaving the I and Q components at baseband frequencies, identified with numeral 314 in the figure.

In the case in which the selected band is the DCS band, the division ratio of the fractional N synthesizer 519 is set such that the output of VCO 518 is at a frequency which is about ¼ the selected receive channel frequency.

A signal is received over antenna 307 and provided to filter 308b by element 306. Filter 308b bandlimits the signal so that it is within the DCS receive band of 1805–1880 MHz, and LNA 309b amplifies the signal. DCR 310b downconverts the signal to baseband frequencies in a single step while filters 526 and 570 suppress the effects of any leakage between the LO and RF inputs of the mixers 527 and 528. These mixers function by switching at twice the frequency applied to the LO inputs thereof, which is the selected channel frequency.

The resulting I and Q signals are input to baseband gain and filter chain 313 which attenuates the components of the I and Q signals at about twice the selected channel frequency, leaving the I and Q components at baseband frequencies, identified with numeral 314 in the figure.

In the transmit mode of operation, in the case in which the selected band is the GSM band, signal line 550 is coupled to antenna 307 by element 306.

Frequency multiplier 531 is set so that the multiplication factor thereof is 3. The output thereof, at the frequency 39 MHz, is applied to the carrier input of quadrature modulator 301. Quadrature modulator 301 modulates the carrier input thereof with the I and Q components of the signal 300 to be transmitted. The carrier frequency of the output of the quadrature modulator 301 is 39 MHz, about the frequency offset of the GSM band.

The output of the quadrature modulator is provided to translation loop upconverter 303. Translation loop upconverter 303 functions to upconvert the frequency of the signal so that it is at the selected transmit channel frequency. The loop functions as follows. The output of VCO 508 is coupled to mixer 510 through multiplexor 509. Phase detector 505 adjusts its output until the phase of the signals at its two inputs are about the same. The effect of this is to adjust the frequency of the output of VCO 508 until this phase relationship is present. This will occur when the frequency at the output of the VCO 508 is equal to twice the frequency of the signal applied to the LO input of mixer 510 (which is about the selected receive channel frequency) minus 39 MHz. More precisely, the frequency of the signal applied to the LO input of mixer 510 is $(F_{TX}+39 \text{ MHz})/2$, where $F_{TX}$ is the transmit frequency. As is desired, this frequency is about equal to the selected receive channel frequency minus the frequency offset for the band.

In the case in which the selected band is the DCS band, signal line 551 is coupled to antenna 307 by element 306.

Frequency multiplier 531 is set so that the multiplication factor thereof is 7. The output thereof, at the frequency 91 MHz, is applied to the carrier input of quadrature modulator 301. Quadrature modulator 301 modulates the carrier input thereof with the I and Q components of the signal 300 to be transmitted. The carrier frequency of the output of the quadrature modulator 301 is 91 MHz, about the frequency offset of the DCS band.

The output of the quadrature modulator is provided to translation loop upconverter 303. Translation loop upconverter 303 functions to upconvert the frequency of the signal so that it is at the selected transmit channel frequency. The loop functions as follows. The output of VCO 507 is coupled to mixer 510 through multiplexor 509. Phase detector 505 adjusts its output until the phase of the signals at its two inputs are about the same. The effect of this is to adjust the frequency of the output of VCO 507 until this phase relationship is present. This will occur when the frequency at the output of the VCO 507 is equal to twice the frequency of the signal applied to the LO input of mixer 510 (which is about the selected receive channel frequency) minus 91 MHz. More precisely, the signal applied to the LO input of mixer 510 is $(F_{TX}+91 \text{ MHz})/2$, where $F_{TX}$ is the transmit frequency. As is desired, this frequency is about equal to the selected receive channel frequency minus the frequency offset for the band.

Figure 9:
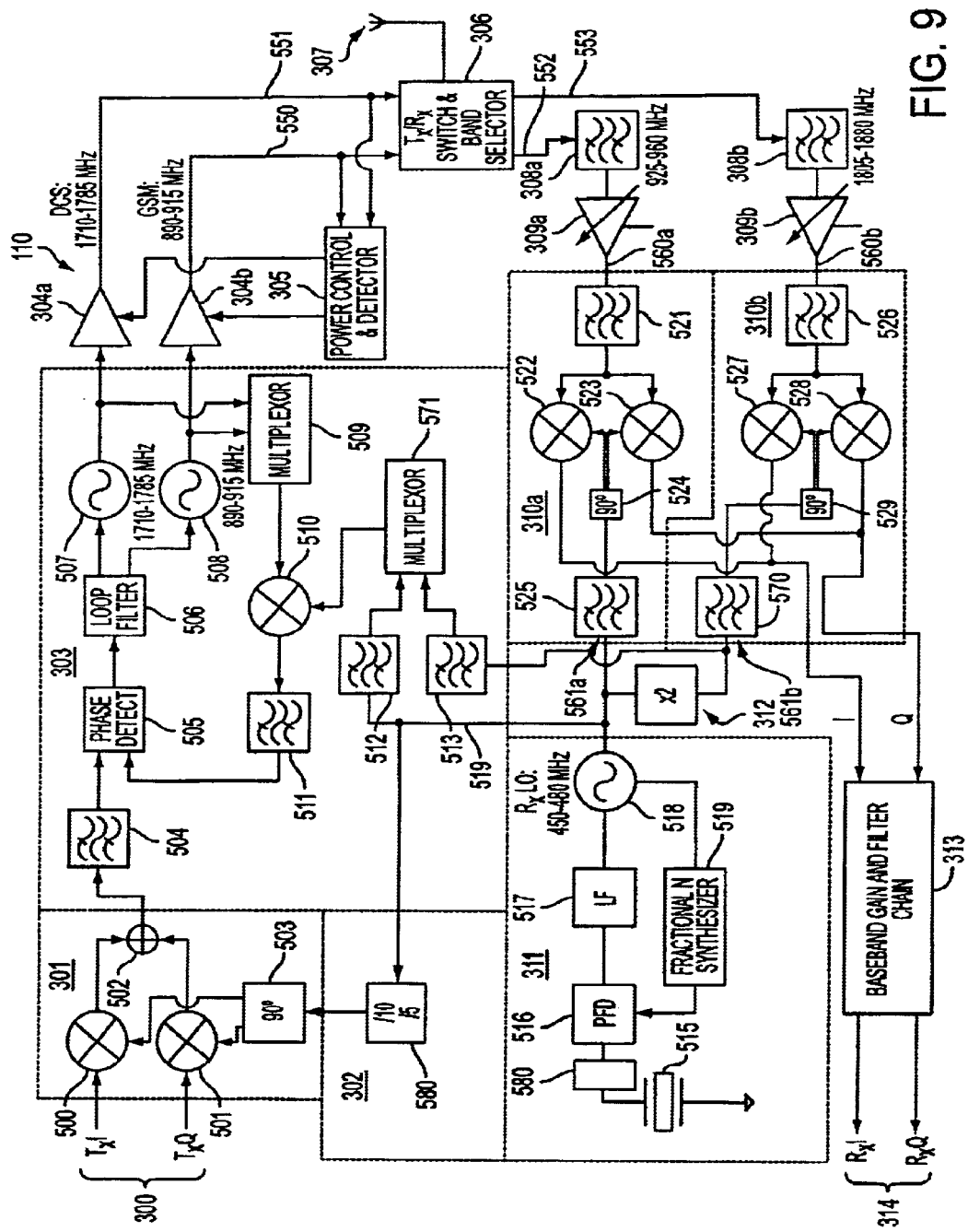
FIG. 9 illustrates a second implementation of the subject invention.

A second implementation of the subject invention is illustrated in FIG. 9. This implementation is identical to that of FIG. 8, except that LOC source 302 is different. In FIG. 9, LCO source 302 comprises frequency divider 580. Frequency divider 580 receives as an input the output of VCO 518, and divides its frequency by a variable divide ratio determined responsive to the selected band. It outputs a signal having the divided down frequency. In the case in which the GSM band is selected, the division ratio is 10, and the frequency of the output signal will range from 45.00–48.00 MHz, about the frequency offset for the GSM band. In the case in which the DCS band is the selected band, the division ratio is 5, and the frequency of the output signal will range from 90.00–96.00 MHz, about the frequency offset for the DCS band. Except for this difference, the implementation of FIG. 9 is identical to that of FIG. 8.

Figure 10:
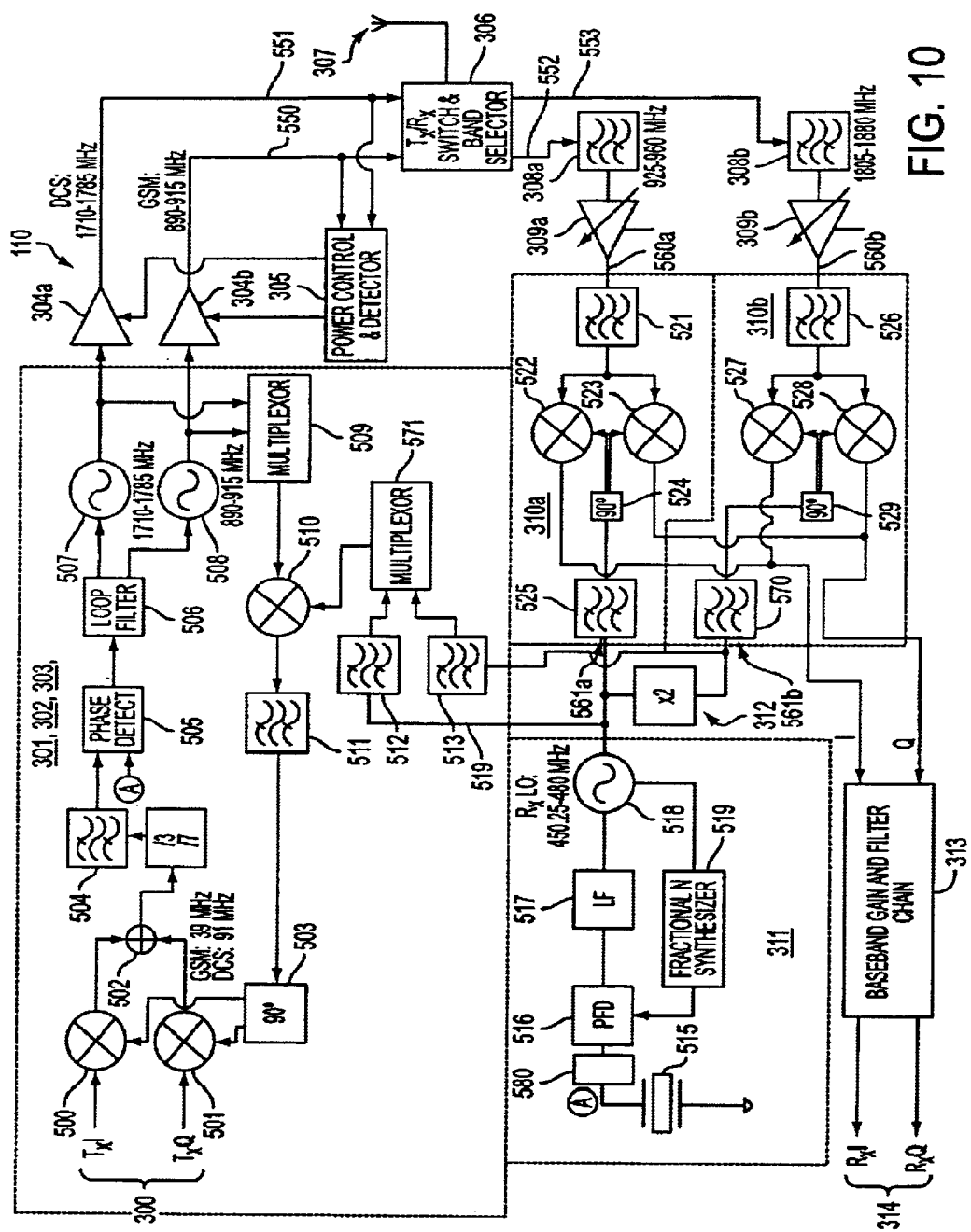
FIG. 10 illustrates a third implementation of the subject invention.

A third implementation of the subject invention is illustrated in FIG. 10. This implementation is identical to that of FIG. 8, except that both quadrature modulator 301 and LCO source 302 have been placed within the loop of translation loop upconverter 303, the inputs of phase detector 505 have been changed, and frequency divider 532 has been added to the loop. More specifically, in the implementation of FIG. 10, the output of quadrature modulator 301 is coupled to frequency divider 532.

Frequency divider 532 divides the frequency of the output of the quadrature modulator 301 by a variable division ratio which depends on the selected band. If the selected band is the GSM band, the division ratio is 3; if the DCS band is the selected band, the division ratio is 7. The output of frequency divider 301 is coupled to filter 504, which has been previously discussed. The output of the filter 504 is coupled to an input of phase detector 505. The other input to phase detector 505 is the 13 MHz output of crystal oscillator 515. The phase detector 505 compares the phases of the two inputs, and adjusts its output until the two are about equal.

The LCO source 302 in this implementation is the output of mixer 510 after passage through the filter 511. When the loop is locked, this output will be at a frequency equal to the division ratio applied by frequency divider 532 multiplied by the 13 MHz reference frequency output from crystal oscillator 515. In the case of the GSM band, that will be 39 MHz; in the case of the DCS band, that will be 91 MHz. This frequency is divided down by divider 532 such that the output of filter 504, when input to phase detector 505, is at 13 MHz. Otherwise, the operation of the loop is as described in relation to the implementation of FIG. 8.

Figure 19:
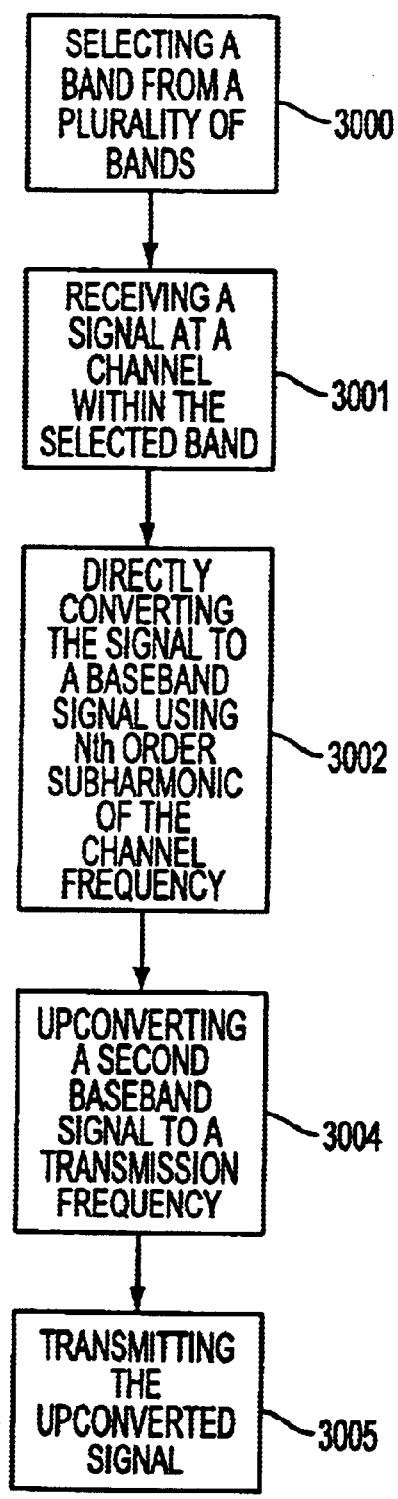
FIG. 19 is a flowchart illustrating one embodiment of a method of operation of a transceiver in accordance with the subject invention.

A related method of providing full duplex transmission and reception is illustrated in FIG. 19. In step 3000, a frequency band is selected from a plurality of bands. In one implementation, the band is selected from the GSM and DCS bands. In another implementation, the band is selected from the GSM, DCS, and PCS bands. In step 3001, a signal is received at a channel within the selected band. In step 3002, the received signal is directly converted to a baseband signal using a first signal which is an nth order subharmonic of the channel frequency, wherein n is an integer greater than 1. In step 3004, a second baseband signal is upconverted to a transmission frequency. In one implementation, this steps comprises the substeps of modulating a carrier signal with the second baseband signal, and then upconverting the modulated signal to the transmission frequency. In one implementation example, the carrier signal is at a frequency about equal to the frequency offset for the selected band, and the transmission frequency is about equal to the frequency of the received signal minus the frequency offset for the selected band.

The foregoing architecture is advantageous because it greatly reduces the cost of a dual-band transceiver by requiring only one main oscillator for the whole system. Furthermore, the oscillator operates at about ½ frequency (GSM band) or about ¼ frequency (DCS band), and needs to tune over a narrow range (about 30 MHz), thus allowing for better VCO phase performance. The usual VHF oscillator and synthesizer are eliminated. Furthermore, it makes use of direct conversion in the receiver, which avoids the usual leakage problems between the LO and RF ports of the mixer, and eliminates the IF mixer.

Although this invention has been described in terms of certain embodiments, implementations, and implementation examples, it should be apparent to those of skill in the art that many other embodiments, implementations, and implementation examples are within the scope of the invention. Accordingly, the scope of the invention should not be limited except in light of the claims and their equivalents.

What is claimed is:

1. A multi-band transceiver comprising:
   a band selector for selecting one of a plurality of frequency bands;
   a receiver portion configurable responsive to the selected band;
   a transmitter portion configurable responsive to the selected band;
   an antenna; and a switch configured to couple the receiver portion to the antenna in a receive mode of operation, and to couple the transmitter portion to the antenna in a transmit mode of operation;

wherein the receiver portion includes:

a direct conversion receiver system for directly downconverting a signal to baseband frequencies;

a tunable local oscillator system for providing a first signal at a first frequency which is an nth order subharmonic of a selected channel frequency within the selected band, wherein n is an integer greater than 1;

wherein the direct conversion receiver system includes a frequency translator having a first input for receiving the first signal, a second input for receiving a second signal having a carrier frequency at the selected channel frequency, and an output, a first filter integral with the first input and configured to substantially attenuate signals at the selected channel frequency, a second filter integral with the second input and configured to substantially attenuate signals at the first frequency;

wherein the frequency translator is configured to switch the second signal to the output through a switching action which occurs at a frequency which is n times the first frequency.

2. The transceiver of claim 1 wherein the transmitter portion includes an upconverter for upconverting a signal to a desired transmission frequency responsive to the first signal.

3. The transceiver of claim 2 wherein the transmitter portion further includes a modulator for modulating a carrier input signal responsive to a baseband signal, and a carrier input source for providing the carrier input signal.

4. The transceiver of claim 3 wherein the upconverter is a translation loop upconverter having a loop.

5. The transceiver of claim 4 wherein the modulator and carrier input source are configured to be outside the loop of the translation loop upconverter.

6. The transceiver of claim 4 wherein the modulator and carrier input source are configured to be within the loop of the translation loop upconverter.

7. The transceiver of claim 4 wherein the loop of the translation loop upconverter includes a downconversion frequency translator having a first input for receiving the first signal, a second input for receiving a second signal at the desired transmission frequency, and an output;

wherein the frequency translator is configured to switch the second signal to the output through a switching action which occurs at a frequency which is n times the first frequency.

8. The transceiver of claim 7 wherein the first filter of the downconversion frequency translator is selectable from a plurality of filters, and switchable into the first input of the frequency translator responsive to the selected band.

9. The transceiver of claim 3 wherein the carrier input source provides a carrier input signal at a frequency about equal to the frequency offset for the selected band.

10. The transceiver of claim 1 wherein the band selector is configured to select a band from the GSM and DCS bands.

11. The transceiver of claim 1 wherein the local oscillator system comprises a local oscillator coupled to a frequency frequency translator.

12. The transceiver of claim 1 wherein n=2.

13. The transceiver of claim 1 wherein the receiver portion has a receiver signal path, and wherein the direct conversion receiver is selectable from a plurality of direct conversion receivers, and switchable into a receiver signal path responsive to the selected band.

14. A wireless communication device including the transceiver of claim 1.

15. The device of claim 14 selected from the group comprising a mobile handset, base station, infrastructure component, and a satellite.

16. A wireless communication system comprising a base station and a plurality of mobile devices configured to communicate with the base station over a wireless interface, at least one of the mobile devices or base station including the, transceiver of claim 1.

17. A multi-band transceiver comprising:

a band selector for selecting one of a plurality of frequency bands;

a receiver portion configurable responsive to the selected band;

a transmitter portion configurable responsive to the selected band;

an antenna; and a switch configured to couple the receiver portion to the antenna in a receive mode of operation, and to couple the transmitter portion to the antenna in a transmit mode of operation;

wherein the receiver portion includes:

a direct conversion receiver system for directly downconverting a signal to baseband frequencies;

a tunable local oscillator system for providing a first signal at a first frequency which is an nth order subharmonic of a selected channel frequency within the selected band, wherein n is an integer greater than 1;

wherein the direct conversion receiver system includes a frequency translator having a first input for receiving the first signal, a second input for receiving a second signal having a carrier frequency at the selected channel frequency, and an output, a first filter integral with the first input and configured to substantially attenuate signals at the selected channel frequency, a second filter integral with the second input and configured to substantially attenuate signals at the first frequency;

wherein the frequency translator is configured to switch the second signal to the output through a switching action which occurs at a frequency which is n times the first frequency; and wherein the transmitter portion includes an upconverter for upconverting a signal to a desired transmission frequency responsive to the first signal.

18. The transceiver of claim 17 wherein the upconverter is a translation loop upconverter having a loop, and the loop of the translation loop upconverter includes a downconversion frequency translator having a first input for receiving the first signal, a second input for receiving a second signal at the desired transmission frequency, and an output;

wherein the frequency translator is configured to switch the second signal to the output through a switching action which occurs at a frequency which is n times the first frequency.

19. A multi-band transceiver comprising:

a band selector for selecting one of a plurality of frequency bands;

a receiver portion configurable responsive to the selected band, the receiver portion having a receiver signal path;

a transmitter portion configurable responsive to the selected band;

an antenna; and a switch configured to couple the receiver portion to the antenna in a receive mode of operation, and to couple the transmitter portion to the antenna in a transmit mode of operation;

wherein the receiver portion includes:

a direct conversion receiver system for directly downconverting a signal to baseband frequencies;

a tunable local oscillator system for providing a first signal at a first frequency which is an nth order subharmonic of a selected channel frequency within the selected band, wherein n is an integer greater than 1;

wherein the direct conversion receiver system includes a frequency translator having a first input for receiving the first signal, a second input for receiving a second signal having a carrier frequency at the selected channel frequency, and an output, a first filter integral with the first input and configured to substantially attenuate signals at the selected channel frequency, a second filter integral with the second input and configured to substantially attenuate signals at the first frequency;

wherein the frequency translator is configured to switch the second signal to the output through a switching action which occurs at a frequency which is n times the first frequency;

wherein the local oscillator system includes a local oscillator and a frequency adjuster which is switchable into the receiver signal path responsive to the selected band.

20. A mobile wireless handset including the transceiver of claim 19.

21. The transceiver of claim 19 wherein the frequency adjuster is a frequency doubler.

22. The transceiver of claim 21 wherein the frequency doubler is selectable responsive to the selected band being the DCS band.

23. The transceiver of claim 19 wherein the local oscillator includes a phase locked loop having a reference frequency provided by a crystal oscillator, the crystal oscillator having a frequency, and the transmitter portion of the transceiver includes a modulator having a carrier input, and a frequency adjuster for providing the carrier input to the modulator, the frequency adjuster configured to receive the output of the crystal oscillator, and to provide an output signal having a frequency equal to the frequency of the crystal oscillator adjusted by a variable amount responsive to the selected band.

24. The transceiver of claim 23 wherein the frequency adjuster is a frequency frequency translator.

25. The transceiver of claim 19 wherein the local oscillator includes a phase locked loop having an output, the output having a frequency, and the transmitter portion of the transceiver includes a modulator having a carrier input, and a frequency adjuster for providing the carrier input to the modulator, the frequency adjuster configured to receive the output of the phase locked loop, and to provide an output signal having a frequency equal to the frequency of the output of the phase locked loop adjusted by a variable amount responsive to the selected band.

26. The transceiver of claim 25 wherein the frequency adjuster is a frequency divider.

27. The transceiver of claim 19 wherein the transmitter portion of the transceiver includes a modulator having a carrier input included within a loop of a translation loop upconverter, and the carrier input to the modulator is derived from a downconversion frequency translator included within the loop of the translation loop upconverter.

28. A method of performing full duplex communication in a multi-band transceiver comprising:

selecting a band from a plurality of bands;

receiving a signal at a channel within the selected band, the channel having a channel frequency;

directly converting the signal to a baseband signal using a first signal having a frequency which is an nth order subharmonic of the channel frequency while switching at n times the frequency of the first signal, wherein n is an integer greater than 1;

upconverting a second baseband signal to a transmission frequency; and transmitting the upconverted signal.

29. The method of claim 28 wherein the upconverting step comprises:

modulating a carrier signal with the second baseband signal; and upconverting the modulated signal to the transmission frequency using the first signal.

30. The method of claim 29 further comprising modulating the second basedband signal with a carrier signal which is the frequency offset for the selected band.

31. The method of claim 28 further comprising selecting a band from the GSM and DCS bands.

* * * * *